United States Patent
Yamashita et al.

(10) Patent No.: US 7,601,236 B2
(45) Date of Patent: Oct. 13, 2009

(54) METHOD OF MANUFACTURING DISPLAY DEVICE

(75) Inventors: Akio Yamashita, Atsugi (JP); Yumiko Fukumoto, Atsugi (JP); Yuugo Goto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 359 days.

(21) Appl. No.: 10/580,464

(22) PCT Filed: Nov. 18, 2004

(86) PCT No.: PCT/JP2004/017537
§ 371 (c)(1),
(2), (4) Date: May 25, 2006

(87) PCT Pub. No.: WO2005/052893

PCT Pub. Date: Jun. 9, 2005

(65) Prior Publication Data

US 2007/0181246 A1 Aug. 9, 2007

(30) Foreign Application Priority Data

Nov. 28, 2003 (JP) .............................. 2003-399926

(51) Int. Cl.
*B29C 65/48* (2006.01)
*B29C 65/54* (2006.01)
*B32B 37/02* (2006.01)
*H01L 21/70* (2006.01)

(52) U.S. Cl. .................. 156/230; 156/235; 156/239; 156/241; 156/247; 156/249; 315/169.3; 345/45; 438/30; 438/455

(58) Field of Classification Search .................. 156/230, 156/235, 239, 241, 247, 249; 315/169.3; 345/45; 438/30, 455, 458
See application file for complete search history.

(56) References Cited

U.S. PATENT DOCUMENTS 3,624,273 A * 11/1971 Gale .......................... 348/796

(Continued)

FOREIGN PATENT DOCUMENTS

CN 1086608 5/1994

(Continued)

OTHER PUBLICATIONS

International Search Report (Application No. PCT/JP2004/017537) dated Mar. 8, 2005.

(Continued)

*Primary Examiner*—Philip C Tucker
*Assistant Examiner*—Sing P Chan
(74) *Attorney, Agent, or Firm*—Eric J. Robinson; Robinson Intellectual Property Law Office, P.C.

(57) ABSTRACT

To provide a method of manufacturing a display device having an excellent impact resistance property with high yield, in particular, a method of manufacturing a display device having an optical film that is formed using a plastic substrate. The method of manufacturing a display device includes the steps of: laminating a metal film, an oxide film, and an optical filter on a first substrate; separating the optical filter from the first substrate; attaching the optical filter to a second substrate; forming a layer including a pixel on a third substrate; and attaching the layer including the pixel to the optical filter.

32 Claims, 20 Drawing Sheets

U.S. PATENT DOCUMENTS

| | | | |
|---|---|---|---|
| 4,800,100 A | | 1/1989 | Herbots et al. |
| 5,156,720 A | | 10/1992 | Rosenfeld et al. |
| 5,324,678 A | * | 6/1994 | Kusunoki .................... 438/459 |
| 5,488,497 A | | 1/1996 | Takanashi et al. |
| 5,757,456 A | * | 5/1998 | Yamazaki et al. ............ 349/151 |
| 5,966,620 A | * | 10/1999 | Sakaguchi et al. ........... 438/455 |
| 5,985,739 A | * | 11/1999 | Plettner et al. ............... 438/455 |
| 5,993,677 A | * | 11/1999 | Biasse et al. .................... 216/36 |
| 6,033,995 A | * | 3/2000 | Muller ........................ 438/749 |
| 6,245,645 B1 | * | 6/2001 | Mitani et al. ................. 438/455 |
| 6,372,608 B1 | * | 4/2002 | Shimoda et al. .............. 438/455 |
| 6,445,005 B1 | | 9/2002 | Yamazaki et al. |
| 6,468,841 B2 | * | 10/2002 | Muramatsu et al. .......... 438/150 |
| 6,562,648 B1 | * | 5/2003 | Wong et al. ..................... 438/46 |
| 6,645,830 B2 | * | 11/2003 | Shimoda et al. .............. 438/455 |
| 6,646,692 B2 | * | 11/2003 | Yamazaki et al. ............... 349/47 |
| 6,808,773 B2 | | 10/2004 | Shimamura et al. |
| 6,818,530 B2 | * | 11/2004 | Shimoda et al. .............. 438/455 |
| 6,867,067 B2 | | 3/2005 | Ghyselen et al. |
| 6,874,898 B2 | | 4/2005 | Akiyama |
| 6,894,312 B2 | | 5/2005 | Yamazaki et al. |
| 6,916,361 B2 | * | 7/2005 | Jackson et al. ................. 95/154 |
| 6,933,210 B2 | * | 8/2005 | Inoue ........................... 438/455 |
| 6,953,735 B2 | * | 10/2005 | Yamazaki et al. ............ 438/457 |
| 7,037,752 B2 | * | 5/2006 | Kuwabara et al. ........... 438/107 |
| 7,041,520 B1 | * | 5/2006 | Hwang et al. .................. 438/30 |
| 7,050,138 B1 | * | 5/2006 | Yamazaki et al. ............ 349/152 |
| 7,084,045 B2 | * | 8/2006 | Takayama et al. ........... 438/455 |
| 7,122,445 B2 | * | 10/2006 | Takayama et al. ........... 438/458 |
| 7,351,300 B2 | * | 4/2008 | Takayama et al. ........... 156/239 |
| 7,351,644 B2 | * | 4/2008 | Henley ........................ 438/458 |
| 2001/0040645 A1 | | 11/2001 | Yamazaki |
| 2002/0121860 A1 | | 9/2002 | Seo et al. |
| 2002/0190257 A1 | | 12/2002 | Yamazaki et al. |
| 2003/0007341 A1 | | 1/2003 | Shimamura et al. |
| 2003/0032210 A1 | | 2/2003 | Takayama et al. |
| 2003/0223138 A1 | | 12/2003 | Akiyama |
| 2004/0231873 A1 | | 11/2004 | Shimamura et al. |
| 2005/0156244 A1 | | 7/2005 | Akiyama |
| 2005/0162092 A1 | | 7/2005 | Yamazaki et al. |
| 2007/0054436 A1 | | 3/2007 | Hirakata et al. |

FOREIGN PATENT DOCUMENTS

| | | |
|---|---|---|
| EP | 1 085 576 | 3/2001 |
| EP | 1 122 794 | 8/2001 |
| EP | 1 220 339 | 7/2002 |
| EP | 1 389 901 | 2/2004 |
| JP | 53-031971 | 3/1978 |
| JP | 2001-075124 | 3/2001 |
| JP | 2001-217072 | 8/2001 |
| JP | 2001-290439 | 10/2001 |
| JP | 2002-341131 | 11/2002 |
| JP | 2003-031778 | 1/2003 |
| JP | 2003-195787 | 7/2003 |
| JP | 2003-258488 | 9/2003 |
| JP | 2003-298284 | 10/2003 |
| JP | 2003-318195 | 11/2003 |
| WO | 2002/096178 | 11/2002 |

OTHER PUBLICATIONS

Written Opinion (Application No. PCT/JP2004/017537) dated Mar. 8, 2005.

Office Action (Application No. 200480035192.4) Dated March 20, 2009.

* cited by examiner

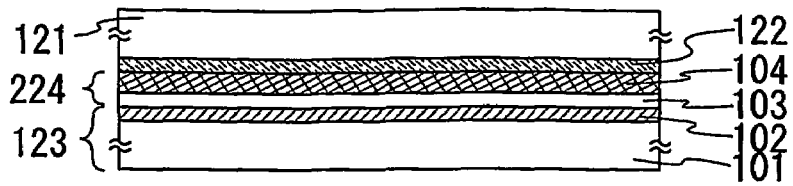
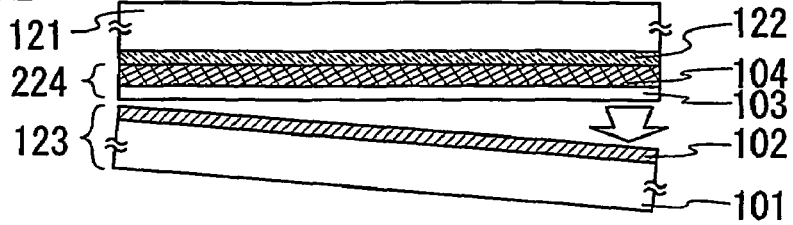
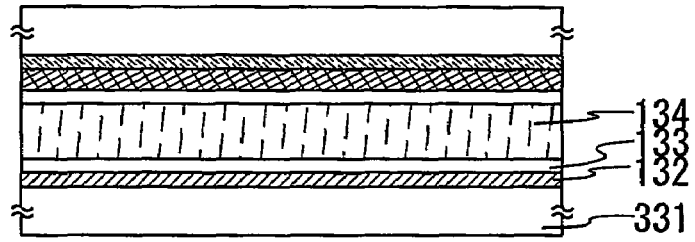
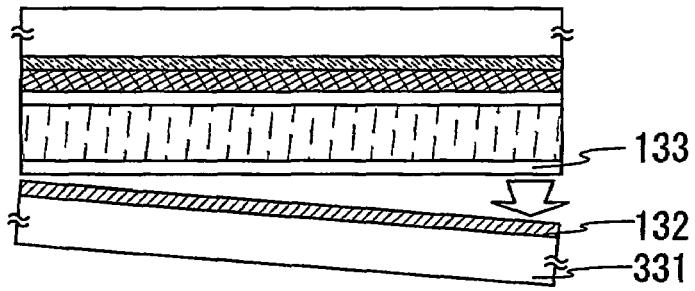
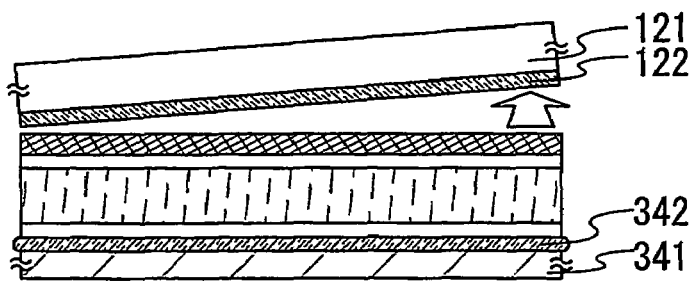
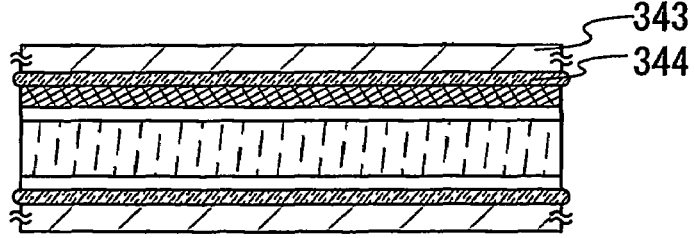

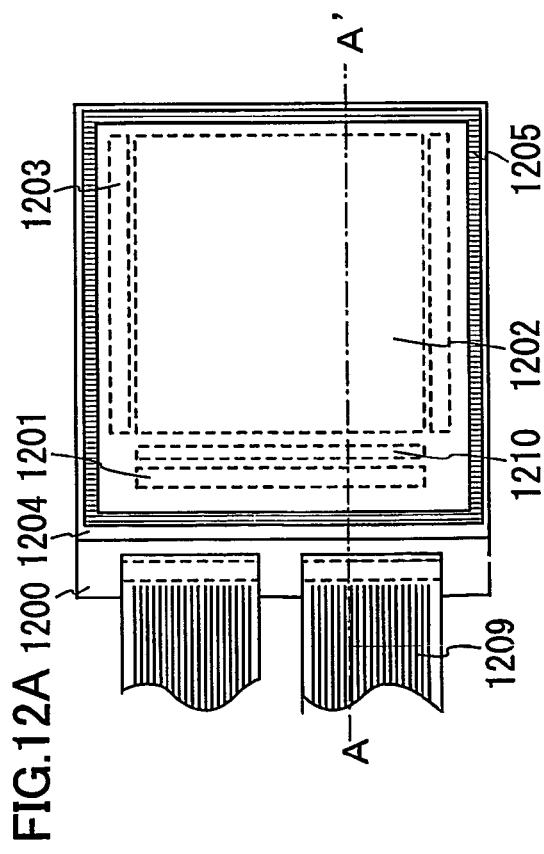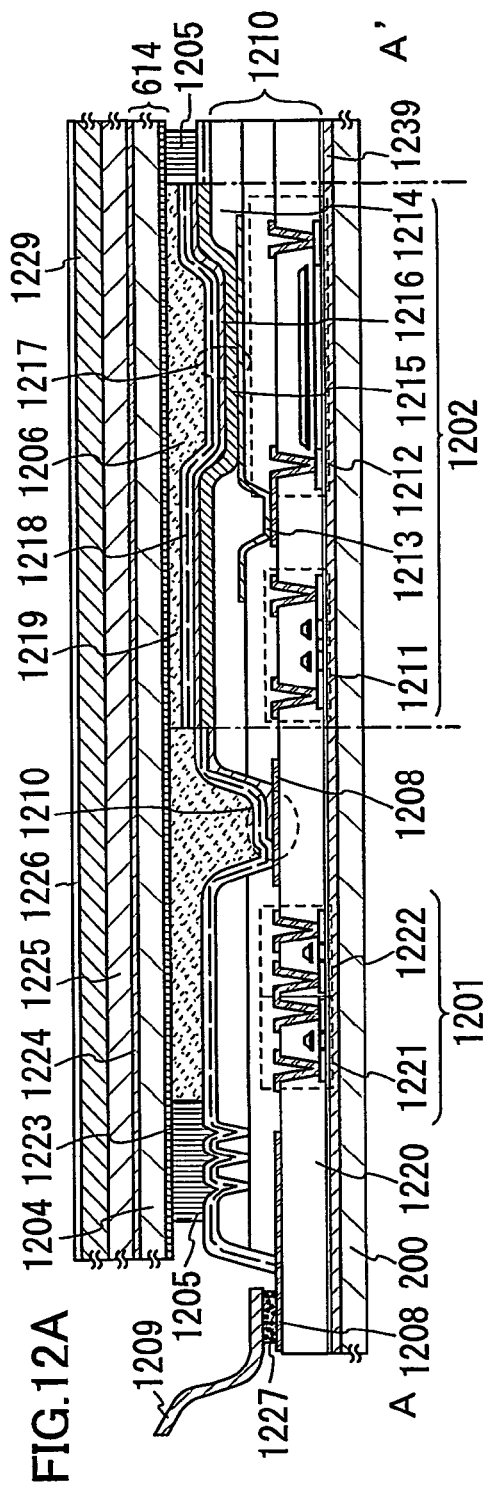

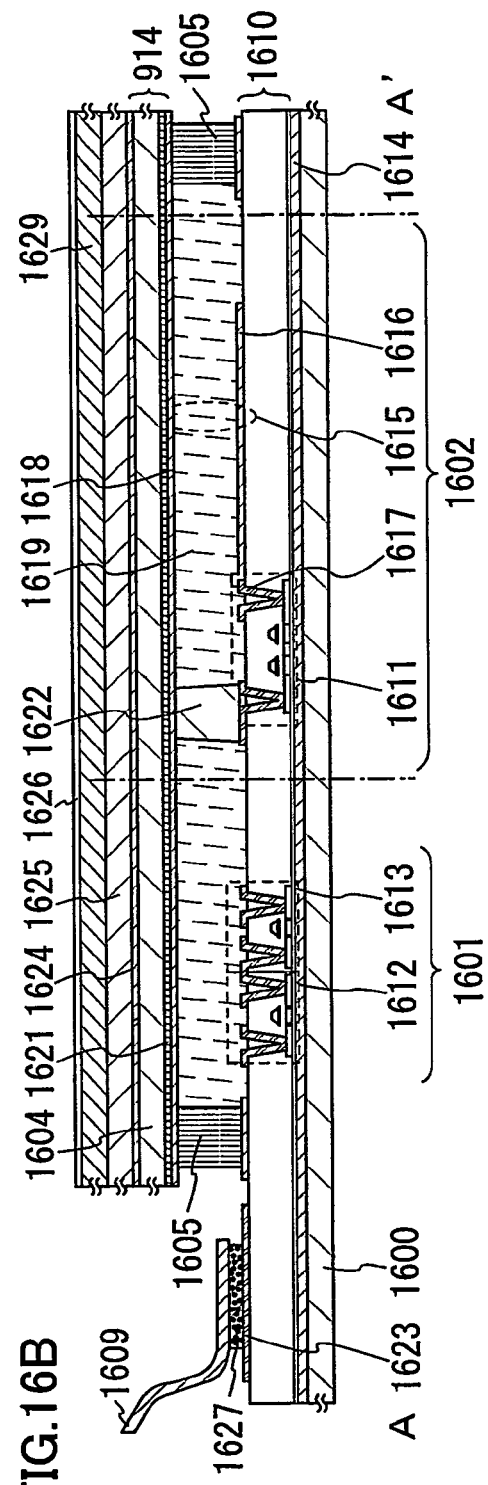

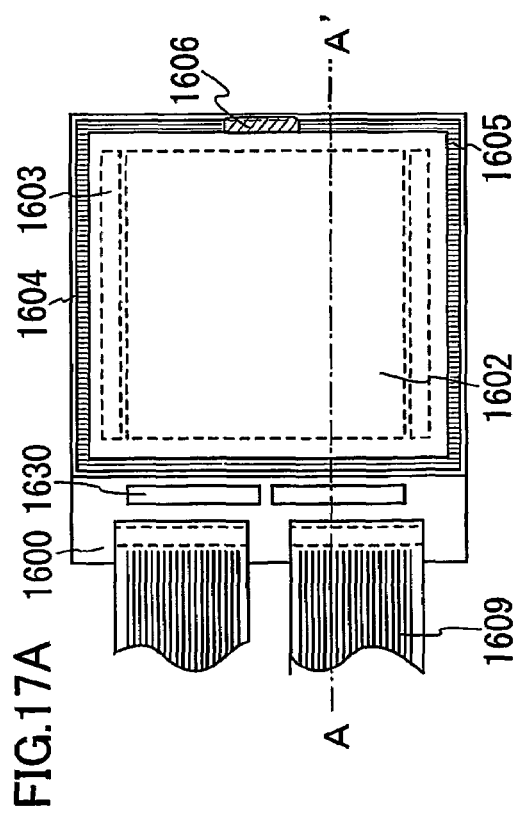
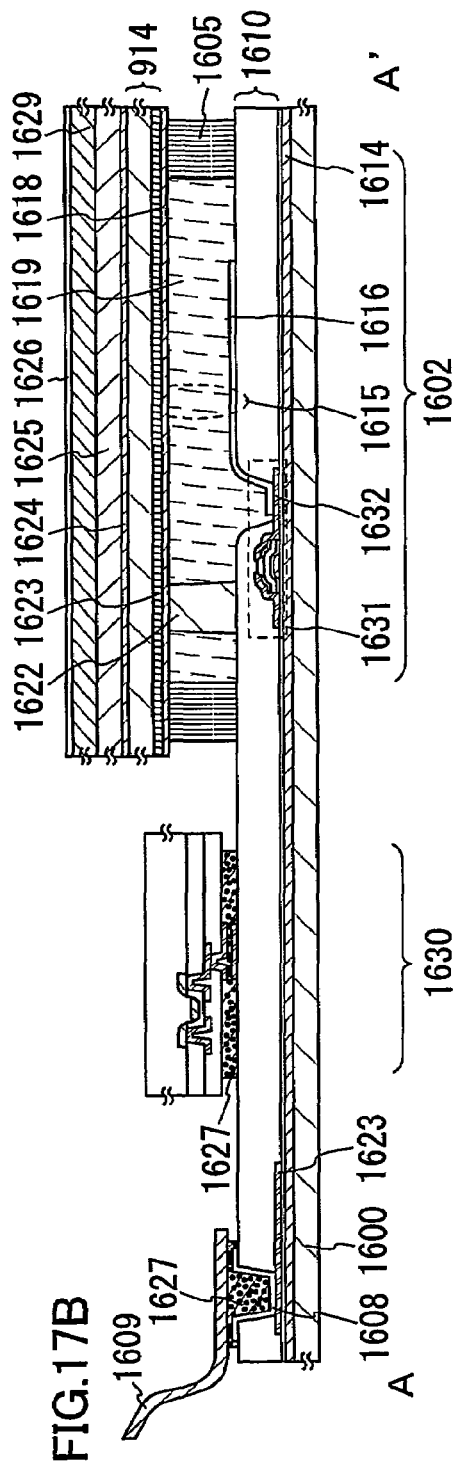
FIG.17A
FIG.17B

METHOD OF MANUFACTURING DISPLAY DEVICE

TECHNICAL FIELD

The present invention relates to a method of manufacturing a display device having an optical film that is formed using a plastic substrate.

BACKGROUND ART

In recent years, a technique of forming a thin film transistor (TFT) using a semiconductor thin film (with a thickness of from approximately several nm to several hundreds nm), which is formed over a substrate with an insulated surface, has been attracting attention. The thin film transistor has been widely applied in various electronic devices such as an IC and an electronic apparatus. In particular, development related to the thin film transistor as a switching element for a liquid crystal display panel or a light emitting display panel has been carried out hurriedly.

In a liquid crystal display panel, a liquid crystal material is sandwiched between an element substrate and an opposing substrate having an opposing electrode that is arranged opposite to the element substrate. On the element substrate, TFTs using amorphous silicon or polysilicon as their semiconductors are arranged in matrix, and pixel electrodes, source wirings, and gate wirings each of which connects to each TFT are formed, respectively. A color filter for performing color display is formed either on the element substrate or the opposing substrate. Polarizing plates are arranged on the element substrate and the opposing substrate as optical shutters, respectively, to display color images.

The color filter of the liquid crystal display panel includes colored layers consisting of R (red), G (green), B (blue), and a light shielding mask (a black matrix) for covering gaps between pixels, and extracts red, green, and blue lights by transmitting light therethrough. A light shielding mask for the color filter is generally made from a metal film or an organic film containing a black pigment. The color filter is arranged at a position corresponding to the pixels, thereby being capable of changing the colors of light to be extracted for each pixel. Note that, the position corresponding to the pixels indicates a portion that accords with a pixel electrode.

In a light emitting display device, there are a colorizing method by arranging light emitting elements that emit red, green, and blue lights, respectively, in matrix; a colorizing method by utilizing a color filter with use of a light emitting element that emits white light; and the like. The colorizing method by utilizing the color filter with use of the light emitting element that emits white light is similar to a colorizing method for a liquid crystal display device using a color filter, in principle (see patent document 1). Patent document 1: Japanese Patent Application Laid-Open No. 2001-217072

DISCLOSURE OF INVENTION

Conventionally, a color filter used for a liquid crystal display device has been formed on a glass substrate. Therefore, there has been a problem in which the color filter formed on the glass substrate and the liquid crystal display device using the color filter have poor impact resistance properties. Also, when the thickness of the glass substrate is reduced to reduce the thickness of the liquid crystal display device, the substrate is likely to be cracked, which results in reduction in yield.

Further, since the glass substrate does not have flexibility, it has been difficult to form a color film on a display device having a curved surface.

A colored resin and a pigment dispersing resin have been generally used as a raw material for the color filter. In order to cure these resins, however, a step of heating at constant temperatures is required. Therefore, it has been difficult to form the color filter on a thermoplastic substrate.

According to the above-mentioned problems, it is an object of the present invention to provide a method of manufacturing a display device having an excellent impact resistance property at high yield, that is, a method of manufacturing a display device having an optical film that is formed using a plastic substrate.

According to one aspect of the invention, there is provided a method of manufacturing a display device that includes: a first step of laminating a metal film, an oxide film, and an optical filter on a first substrate; a second step of attaching a second substrate to the optical filter; a third step of separating the first substrate from the optical filter; and a fourth step of forming a layer including a pixel on a surface of a third substrate after the first to fourth steps, and attaching the optical filter to another surface of the layer including the pixel.

According to another aspect of the invention, there is provided a method of manufacturing a display device that includes: a first step of laminating a first metal film, a first oxide film, and an optical filter on a first substrates a second step of separating the optical filter from the first substrate; a third step of attaching a second substrate to the optical filter; a fourth step of laminating a second metal film and a second oxide film on a third substrate after the first to third steps, forming a layer including a pixel on a surface of the oxide film, and attaching the layer including the pixel to the optical filter; and a fifth step of separating the second metal film from the second oxide film, and attaching a fourth substrate to another surface of the separated second oxide film.

Note that, after carrying out the first and second steps, the third step can be performed. Also, after carrying out the first and third steps, the second step can be carried out.

Display devices such as a liquid crystal display device, a light emitting display device, a DMD (digital micromirror device), a PDP (plasma display panel), a FED (field emission display), and an electrophoretic display device (an electronic paper) can be cited as representative examples as the display device.

In the case of using a liquid crystal display device, a liquid crystal material is filled between a pixel electrode and an optical filter. A pixel electrode may be provided on the optical filter. When a pixel electrode is formed only on a side of the liquid crystal material, the liquid crystal display device is the one that can perform IPS mode display. When two pixel electrodes are provided sandwiching the liquid crystal material, the liquid crystal display device is the one that can perform TN (twisted nematic) mode display, STN (super twisted nematic) mode display, and VA (vertical alignment) mode display.

In the case of using a light emitting display device, a light emitting element includes a first electrode, a second electrode, and a layer containing a luminescent substance that is provided between the electrodes, wherein the first electrode is provided on the third substrate, and the second electrode is provided on a substrate (i.e., the second substrate or the fourth substrate) that is opposite of the third substrate. The light emitting element having such a structure carries out a passive matrix driving display. Alternatively, in the case where a light emitting element includes a first pixel electrode, a layer containing a luminescent substance, and a second pixel electrode that are provided on the third substrate, the light emitting element having such a structure carries out an active matrix driving display.

The optical filter is a color filter, a color conversion filter, or a hologram color filter.

The second substrate is formed of a plastic substrate. In this case, the optical film including the second substrate and the optical filter is a film having a color filter, a color conversion filter, or a hologram color filter.

An optical film can be used as the second substrate. As for the optical film, a polarizing plate, an elliptical polarizing plate or a circular polarizing plate composed of a retardation plate and a polarizing palate, an antireflection film, a viewing angle improvement film, a protective film, a luminance improvement film, a prism sheet, and the like can be employed. The optical film including the optical filter and the fourth substrate exhibits multiple optical properties.

The present invention further includes the following aspects.

According to an aspect of the invention, there is provided a method of manufacturing a display device that includes: a first step of sequentially laminating a first metal film, a first oxide film, and an optical filter on a first substrate, attaching a first support medium to a surface of the optical filter by using a first peelable adhesive agent such that the first support medium faces the first substrate through the optical filter, and separating the first metal film from the first oxide film by a physical means; a second step of forming a layer including a pixel on a second substrate; and a third step of attaching the first oxide film to a surface of the layer including the pixel of the second substrate by using a first adhesive material after the first and second steps, and removing the first peelable adhesive agent and the first support medium.

After the third step, the third substrate may be attached to the surface of the optical filter by using a second adhesive material.

In this case, the first and second substrates are any of a quartz substrate, a ceramic substrate, a silicon substrate, a metal substrate, and a stainless substrate, while the third substrate is any one of plastic, a polarizing plate, a polarizing plate (an elliptical polarizing plate or a circular polarizing plate) having a retardation plate, an antireflection film, a viewing angle improvement film, a protective film, a luminance improvement film, a prism sheet, and the like.

In the second step or the third step, the surface of the second substrate can be attached with plastic, a polarizing plate, a polarizing plate (an elliptical polarizing plate or a circular polarizing plate) having a retardation plate, an antireflection film, a viewing angle improvement film, a protective film, a luminance improvement film, a prism sheet, and the like.

Further, according to another aspect of the invention, there is provided a method of manufacturing a display device that includes: a first step of sequentially laminating a first metal film, a first oxide film, and an optical filter on a first substrate, attaching a second substrate to a surface of the optical filter by using a first adhesive material such that the second substrate faces the first substrate through the optical filter, attaching a first support medium to a surface of the second substrate by using a first peelable adhesive agent, and separating the first metal film from the first oxide film by a physical means so as to form an optical film; a second step of forming a layer including a pixel on a third -substrate; and a third step of attaching the first oxide film to a surface of the layer including the pixel of the third substrate after the first and second steps, and removing the first peelable adhesive agent and the first support medium.

Further, according to another aspect of the invention, there is provided a method of manufacturing a display device that includes: a first step of sequentially laminating a first metal film, a first oxide film, and an optical filter on a first substrate, attaching a first support medium to a surface of the optical filter by using a first peelable adhesive agent such that the first, support medium faces the first substrate through the optical filter, separating the first metal film from the first oxide film by a physical means, attaching a second substrate to a surface of the first oxide film by using a first adhesive material, and removing the first support medium and the first peelable adhesive agent so as to form an optical film; a second step of forming a layer including a pixel on a third substrate; and a third step of attaching the optical filter to a surface of the layer including the pixel of the third substrate by using a second adhesive material after the first and second steps.

The first and third substrates are any of a quartz substrate, a ceramic substrate, a silicon substrate, a metal substrate, and a stainless substrate, while the second substrate is any one of plastic, a polarizing plate, a polarizing plate (an elliptical polarizing plate or a circular polarizing plate) having a retardation plate, an antireflection film, a viewing angle improvement film, a protective film, a luminance improvement film, a prism sheet, and the like.

After the second and third steps, the surface of the third substrate can be attached with plastic, a polarizing plate, a polarizing plate (an elliptical polarizing plate or a circular polarizing plate) having a retardation plate, an antireflection film, a viewing angle improvement film, a protective film, a luminance improvement film, a prism sheet, and the like.

Further, according to another aspect of the invention, there is provided a method of manufacturing a display device that includes: a first step of sequentially laminating a first metal film, a first oxide film, and an optical filter on a first substrate, attaching a first support medium to a surface of the optical filter by using a first peelable adhesive agent such that the first support medium faces the first substrate through the optical filter, and separating the first metal film from the first oxide film by a physical means; and a second step of sequentially laminating a second metal film and a second oxide film on a second substrate, and forming a pixel electrode on the second oxide film; and a third step of attaching the first oxide film to a surface of the layer including the pixel of the second substrate by using a first adhesive material after the first and second steps, separating the second metal film from the second oxide film by using a physical means, attaching a third substrate to a surface of the second oxide film by using a second adhesive material, and removing the first peelable adhesive agent and the first support medium.

After the third step, a fourth substrate may be attached to the surface of the optical filter by using a third adhesive material.

In this case, the first and second substrates are any of a quartz substrate, a ceramic substrate, a silicon substrate, a metal substrate, and a stainless substrate, while the third and fourth substrates are any of plastics, a polarizing plate, a polarizing plate (an elliptical polarizing plate or a circular polarizing plate) having a retardation plate, an antireflection film, a viewing angle improvement film, a protective film, a luminance improvement film, a prism sheet, and the like.

Further, according to another aspect of the invention, there is provided a method of manufacturing a display device that includes: a first step of sequentially laminating a first metal film, a first oxide film, and an optical filter on a first substrate, attaching a second substrate to a surface of the optical filter by using a first adhesive material such that the second substrate faces the first substrate through the optical filter, attaching a first support medium to a surface of the second substrate by using a first peelable adhesive agent, and separating the first metal film from the first oxide film by a physical means so as to form an optical film; a second step of sequentially laminating a second metal film and a second oxide film on a third substrate, and forming a layer including a pixel on the second oxide film; and a third step of attaching the first oxide film to a surface of the layer including the pixel of the third substrate by using a second adhesive material after the first and second steps, separating the second metal film from the second oxide film by a physical means, attaching a fourth substrate to a surface of the second oxide film by using a third adhesive material, and removing the first peelable adhesive agent and the first support medium.

Further, according to another aspect of the invention, there is provided a method of manufacturing a display device that includes: a first step of sequentially laminating a first metal film, a first oxide film, and an optical filter on a first substrate, attaching a first support medium to a surface of the optical filter by using a first peelable adhesive agent such that the first support medium faces the first substrate through the optical filter, and separating the first metal film from the first oxide film by a physical means; a second step of attaching a second substrate to a surface of the first oxide film by using a first adhesive material, and removing the first support medium and the first peelable adhesive agent so as to form an optical film; a third step of sequentially laminating a second metal film and a second oxide film on a third substrate, and forming a layer including a pixel on the second oxide film; and a fourth step of attaching the optical filter to a surface of the layer including the pixel by using a second adhesive material after first to third steps, separating the second metal film from the second oxide film by a physical means, and attaching a fourth substrate to a surface of the second oxide film by using a third adhesive material.

A first metal oxide film may be formed between the first metal film and the first oxide film simultaneously with forming the first metal film and the first oxide film. Also, a second metal oxide film may be formed between the second metal film and the second oxide film simultaneously with forming the second metal film and the second oxide film.

The first oxide film may be formed after oxidizing the surface of the first metal film to form a first metal oxide film. Similarly, the second oxide film may be formed after oxidizing the surface of the second metal film to form a second metal oxide film.

Further, a semiconductor element is electrically connected to the pixel electrode. As for the semiconductor element, a TFT, an organic semiconductor transistor, a diode, an MIM element, and the like are used.

Preferably, the first substrate is a heat-resistant substrate. Typically, a glass substrate, a quartz substrate, a ceramic substrate, a silicon substrate, a metal substrate, and a stainless substrate can be used as the first substrate.

The first and second metal films may be formed of an element selected from titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir); a single layer formed of an alloy material or a compound material containing the above-mentioned elements as its main constituent; a lamination layer thereof; or nitrides thereof.

Further, after forming a spacer on the surface of the layer including the pixel, it can be attached to the second or third substrate.

According to the invention, the display device indicates a device using a display element, i.e., an image display device. Further, the display device includes all of a module in which a liquid crystal element is attached with a connector, e.g., a flexible printed circuit (FPC), a TAB (tape automated bonding) tape, or a TCP (tape carrier package); a module having a printed wiring board provided on an end of a TAB tape or a TCP; and a module in that a display element is directly mounted with an IC (integrated circuit) or a CPU by the COG (chip on glass) technique.

In accordance with the present invention, a display device having an optical film that includes a plastic substrate can be formed. As a consequence, a lightweight, thin display device having an excellent impact resistance property can be formed. In addition, a display device having a curved surface or a display device, which can be varied in shape, can be manufactured.

In a display device using an optical film according to the invention, a layer including a pixel and an optical film are individually formed through different steps, and they are attached to each other after completion. By using such a structure, the yield of a display element or a semiconductor element and the yield of the optical film can be controlled individually, thereby suppressing reduction in the yield of the entire display device.

Furthermore, the steps of manufacturing an active matrix substrate and the steps of manufacturing an optical film can be run simultaneously, reducing the manufacturing lead time of the display device.

BRIEF DESCRIPTION OF DRAWINGS

FIGS. 3A to 3F are cross sectional views explaining steps of manufacturing a display device according to the present invention;

FIG. 12A is a top view and FIG. 12B is a cross sectional view showing a display panel manufactured according to the invention;

FIG. 16A is a top view and FIG. 16B is a cross sectional view showing a display panel manufactured according to the invention;

FIG. 17A is a top view and FIG. 17B is a cross sectional view showing a display panel manufactured according to the invention;

BEST MODE FOR CARRYING OUT THE INVENTION

Embodiment Mode 1

A method of manufacturing a display device having an optical film that is formed using a plastic substrate will be described in the present embodiment mode with reference to FIGS. 1A to 1E.

Figure 1A:
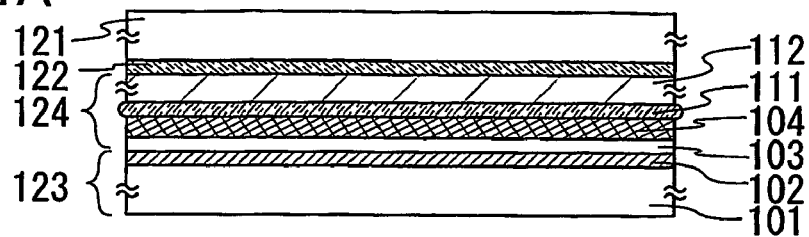
FIGS. 1A to 1E are cross sectional views explaining steps of manufacturing a display device according to the present invention.

As shown in FIG. 1A, a first metal film 102 is formed on a first substrate 101. As the first substrate, a heat-resistant material, i.e., a material that can withstand a heat treatment in subsequent steps of manufacturing an optical filter and separating, typically, a glass substrate, a quartz substrate, a ceramic substrate, a silicon substrate, a metal substrate, or a stainless substrate can be used.

The first metal film 102 may be formed of an element selected from titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir); a single layer formed of an alloy material or a compound material containing the above-mentioned elements as its main constituent; or a lamination layer thereof. The first metal film may also be formed of nitrides of the above-mentioned elements or a lamination layer thereof. Note that conditions of the subsequent separation step are varied by adjusting a composition ratio of metal in alloy for the first metal film or a composition ratio of oxygen or nitrogen contained therein, properly. Therefore, the separation step can be adapted to various kinds of processing. The first metal film 102 is formed by a known manufacturing method such as sputtering, CVD, and vapor deposition to have a thickness of 10 to 200 nm, preferably, 50 to 75 nm.

A first oxide film 103 is next formed on the first metal film 102. In this case, a first metal oxide film is formed between the first metal film 102 and the first oxide film 103. When carrying out the separation step in the subsequent step, separation will be caused inside the first metal oxide film, in an interface between the first metal oxide film and the first oxide film, or in an interface between the first metal oxide film and the first metal film. As for the first oxide film 103, a layer may be formed of silicon oxide, silicon oxynitride, or metal oxide by sputtering or plasma CVD. It is desirable that the thickness of the first oxide film 103 be thicker than that of the first metal film 102, preferably, at least two times, or more preferably, at least four times as thicker as the first metal film 102. The thickness of the first oxide film 103 is, herein, set to 200 to 800 nm, preferably, 200 to 300 nm.

An optical filter 104 is next formed on the first oxide film 103. As representative examples of the optical filter, a color filter, a color conversion filter, a hologram color filter, and the like can be cited.

Subsequently, a second substrate 112 is pasted to a surface of the optical filter 104 by using a first adhesive material 111. Various kinds of curing adhesive materials including a reactive curing adhesive material, a thermal curing adhesive material, a light curing adhesive material such as an ultraviolet curing adhesive material, and an anaerobic curing adhesive material can be used as the adhesive material. As representative examples of these materials, organic resins such as an epoxy resin, an acrylic resin, and a silicon resin can be cited.

A plastic substrate (a film made from a high molecular weight material or a resin) is used as the second substrate 112. As representative examples of the plastic substrate, plastic substrates such as polycarbonate (PC); ARTON formed of norbornene resin with a polar radical that is manufactured by JSR Corporation; polyethylene terephthalate (PET); polyether sulfone (PES); polyethylene naphthalate (PEN); nylon; polyether ether ketone (PEEK); polysulfone (PSF); polyetherimide (PEI); polyarylate (PAR); polybutylene terephthalate (PBT); and polyimide can be used. Besides, optical films such as a polarizing plate, a polarizing plate (an elliptical polarizing plate or a circular polarizing plate) having a retardation plate, an antireflection film, a viewing angle improvement film, a protective film, a luminance improvement film, and a prism sheet can be used as the second substrate.

Subsequently, a first support medium 121 is attached to a surface of the second substrate 112 with a first peelable adhesive agent 122. At this moment, when air bubbles intrude between the second substrate 112 and the first peelable adhesive agent 122, the optical filter will be easily cracked in the subsequent separation step. In order to prevent cracking, the first support medium is attached thereto so as not to generate air bubbles therebetween. By using a tape mounter device and the like, the fist support medium can be attached at short times without mixing air bubbles therebetween.

Preferably, a substrate having higher rigidity than those of the first substrate 101 and the second substrate 112, typically, a quartz substrate, a metal substrate, or a ceramic substrate is used as the first support medium 121.

As for the first peelable adhesive agent 122, an adhesive material made from an organic resin can be used. Representatively, followings can be exemplified: various kinds of peelable adhesive materials including a reactive peelable adhesive material, a thermal peelable adhesive material, a light peelable adhesive material such as an ultraviolet peelable adhesive material, and an anaerobic peelable adhesive material; and a member having adhesive layers made from the above peelable adhesive materials on both surfaces thereof (typically, a two-sided tape, and a two-sided sheet).

In FIG. 1A, the first substrate 101 and the first metal film 102 formed thereon are referred to as a first separation body 123. Further, layers from the first oxide film 103 to the second substrate 112 (i.e., layers sandwiched between the first metal film 102 and the first peelable adhesive agent 122) are referred to as a first subject body 124.

It is preferable that a support medium be bonded to the first substrate 101 by using a peelable adhesive agent so as to prevent breakage of each substrate. By bonding the support medium thereto, the separation step, which will be carried out later, can be performed easily with a smaller force. Preferably, a substrate having higher rigidity than that of the first substrate, typically, a quartz substrate, a metal substrate, and a ceramic substrate are used as the support medium.

Figure 1B:
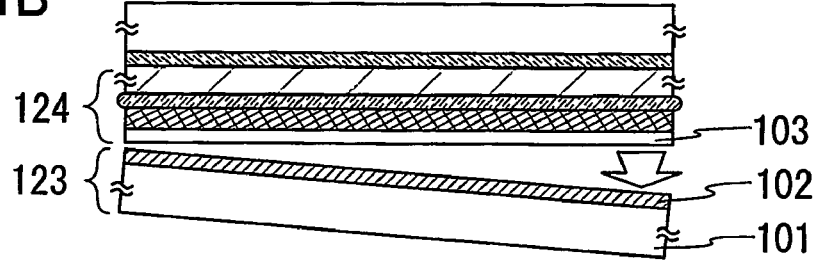

As shown in FIG. 1B, the first separation body 123 is next separated from the first subject body 124 by a physical means. The physical force indicates, for example, a relatively small force such as hand power, gas pressure applied through a nozzle, ultrasonic waves, and load using a wedge-shaped member.

As a result, separation is caused inside the first metal film 102, inside the first metal oxide film, in an interface between the first metal oxide film and the first oxide film, or in an interface between the first metal oxide film and the first metal film so that the first separation body 123 can be separated from the first subject body 124 by a relatively small force.

To separate the separation body easily, a pretreatment is preferably carried out as a previous step prior to the separation step. Typically, a treatment for partly reducing the adhesiveness between the first metal film 102 and the first oxide film 103 is performed. The treatment for partly reducing the adhesiveness therebetween is performed by partly irradiating laser beam to the first metal film 102 along a rim of a region to be separated, or performed by partly damaging inside or an interface of the first metal film 102 by locally applying pressure along a rim of a region to be separated from an external portion. Specifically, a hard needle such as a diamond pen may perpendicularly be pressed and moved while applying load thereto. A scriber device is preferably used to move the hard needle while applying pressure with press force of from 0.1 to 2 mm. Accordingly, it is important to form a portion where a separation phenomenon is easily caused, i.e., a trigger of the separation phenomenon, prior to performing the separation step. By performing the pretreatment of selectively (partly) reducing the adhesiveness in advance, poor separation can be prevented, thereby improving the yield.

According to the above-mentioned steps, an optical film provided on the plastic substrate can be formed. The plastic substrate and the optical filter formed thereon (i.e., the first subject body 124) are, herein, referred to as an optical film.

In the optical film according to the present embodiment mode, an organic resin that is the adhesive material 111 is interposed between the optical filer and the second substrate 112, while the first oxide film 103 is provided on a surface of the optical filter, where is opposite to a surface contacting to the organic resin.

The second substrate 112 can be made from an optical film such as a polarizing plate, a retardation plate, and a light diffusing film. A known antireflection film can further be provided on a surface of the second substrate or the oxide film. By using the structure, an optical film having plural optical properties can be formed.

Figure 1C:
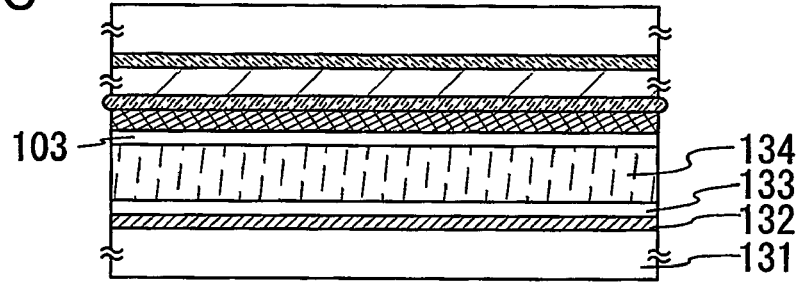

As shown in FIG. 1C, a second metal film 132 and a second oxide film 133 are sequentially formed on a third substrate 131. A substrate formed of the same material as the first substrate can be used as the third substrate. Also, the second metal film 132 can be formed using the same manufacturing steps, material, and structure as the first metal film 102. Similarly, the second oxide film 133 can be formed using the same manufacturing steps, material, and structure as the first oxide film 103.

A layer 134 including a pixel is formed on the second oxide film 133. The layer including the pixel represents a layer on which an element or an electrode functioning as a pixel, typically, a liquid crystal element, a light emitting element, a pixel electrode, a micromirror array, an electron emitter, and the like are provided in a display device. Besides, an element for driving the pixel, typically, a TFT, an organic semiconductor transistor, a diode, an MIM element, and the like may also be provided thereon.

The first subject body 124, i.e., the optical film that is formed in FIG. 1B is attached to the surface of the layer 134 including the pixel. Specifically, the first oxide film 103 of the first subject body 124 is attached to the surface of the layer 134 including the pixel by using a second adhesive material (not shown). The same material as the first adhesive material 111 can be used for the second adhesive material.

Figure 1D:
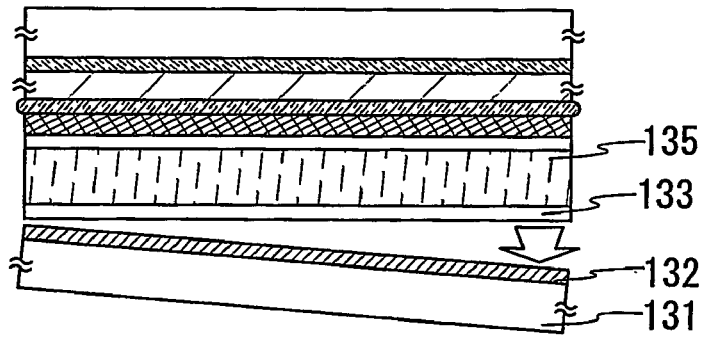

As shown in FIG. 1D, the second oxide film 133 is separated from the second metal film 132 by using a physical means in the same manner as the step as shown in FIG. 1B. According to the step, the third substrate 131 and the second metal film 132 are separated from the second oxide film 133.

Figure 1E:
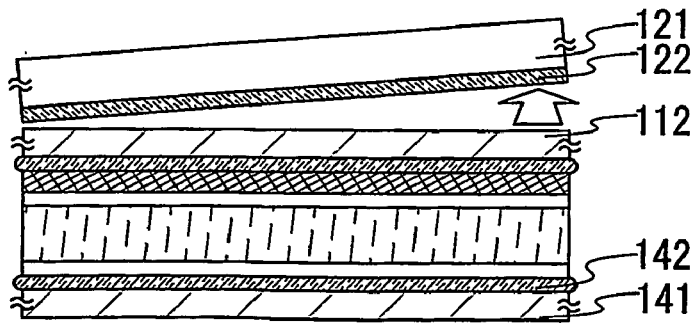

As shown in FIG. 1E, a fourth substrate 141 is attached to a surface of the second oxide film 133 or the second metal oxide film with a third adhesive material 142. A plastic substrate can be employed for the fourth substrate 141 as well as the second substrate 112. The first peelable adhesive agent 122 and the first support medium 121 are separated from the second substrate 112.

According to the above-mentioned steps, a display device including the optical film formed with the plastic substrate can be fabricated. As a consequence, a lightweight, thin display device having an excellent impact resistance property can be formed. In addition, a display device having a curved surface or a display device that can be varied in shape can be manufactured.

Embodiment Mode 2

In the present embodiment mode, a method of manufacturing an optical film, and a method of manufacturing a display device using the same will be described with reference to FIGS. 2A to 2F. Note that the optical film of the embodiment mode includes different structure of that of Embodiment Mode 1 with respect to bonding surfaces for the optical filter and the second substrate.

Figure 2A:
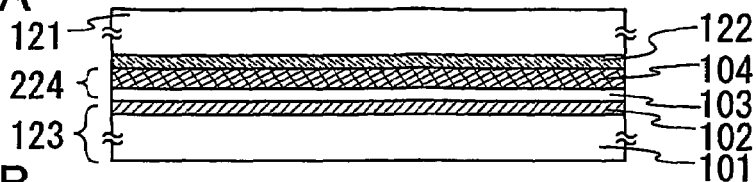
FIGS. 2A to 2F are cross sectional views explaining steps of manufacturing a display device according to the present invention.

As shown in FIG. 2A, a first metal film 102 and a first oxide film 103 are sequentially formed on a first substrate 101, and an optical filter 104 is formed on the first oxide film 103 in the same manner as Embodiment Mode 1. Note that a first metal oxide film is formed between the first metal film and the first oxide film.

A first support medium 121 is attached to a surface of the optical filter 104 with a first peelable adhesive agent 122. The first substrate 101 and the first metal film 102 formed thereon are, herein, referred to as a first separation body 123. Meanwhile, the first oxide film 103 and the optical filter 104 (i.e. layers sandwiched between the first metal film 102 and the first peelable adhesive agent 122) are referred to as a subject body 224.

A support medium is preferably bonded to the first substrate 101 with a peelable adhesive agent so as to prevent breakage of each substrate. By bonding the support medium thereto, the separation step, that will be carried out later, can be performed easily with a smaller force. Preferably, a substrate having higher rigidity than that of the first substrate, typically, a quartz substrate, a metal substrate, and a ceramic substrate are used as the support medium.

In the case where the surface of the optical filter 104 is uneven, a planarizing layer may be provided on the surface of the optical filter. By providing the planarizing layer, air bubbles can be prevented from intruding between the optical filter 104 and the first peelable adhesive agent 122, thereby improving the reliability of the separation step. The planarizing layer can be made from a material that can be formed by application such as an applied insulating film and an organic resin. When the planarizing layer is formed using a peelable material, typically, an adhesive material, the layer can be removed later.

Figure 2B:
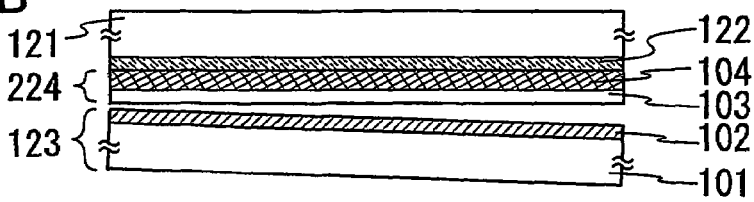

As depicted in FIG. 2B, the first separation body 123 is separated from the first subject body 224 using a physical means. To separate the separation body easily, the pretreatment as described in Embodiment Mode 1 is preferably carried out as a previous step before the separation step. By performing the pretreatment, separation is caused inside the first metal oxide film, in an interface between the first metal oxide film and the first oxide film, or in an interface between the first metal oxide film and the first metal film so that the first separation body 123 can be separated from the first subject body 224 with a relatively small force. The physical means as explained in Embodiment Mode 1 may be employed properly.

Figure 2C:
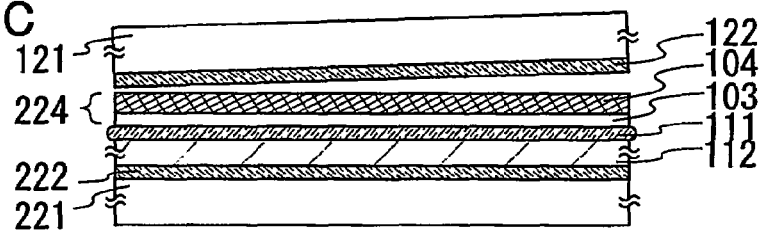

As shown in FIG. 2C, the first oxide film 103 and a second substrate 112 are attached to each other by using the first adhesive material 111. A second support medium 221 is next attached to a surface of the second substrate using a second peelable adhesive agent 222. Afterwards, the first peelable adhesive agent 122 and the first support medium 121 are removed from the optical filter 104. The same materials and structures as those of the first peelable adhesive agent 122 and the first support medium 121 can be used for the second peelable adhesive agent 222 and the second support medium 221, respectively.

In accordance with the above-described steps, an optical film can be formed. That is, the optical filter 104 can be provided on the second substrate 112.

In the embodiment, an organic resin that is the adhesive material 111 and the first oxide film 103 are interposed between the second substrate 112 and the optical filter 104.

Alternatively, the separation step as shown in FIGS. 2A and 2B may be performed after forming a conductive film as a pixel electrode on a surface of the optical filter 104. According to the step, an optical film having the pixel electrode can be formed.

As the second substrate 112, it is possible to use a polarizing plate; a polarizing plate (including an elliptical polarizing plate and a circular polarizing plate) with a retardation plate; an antireflection film; a viewing angle improvement film; a protective film; a luminance improvement film; a prism sheet; and the like. Also, a known antireflection film can be formed on the surface of the second substrate. By utilizing the structure, an optical film having plural optical properties can be formed.

Figure 2D:
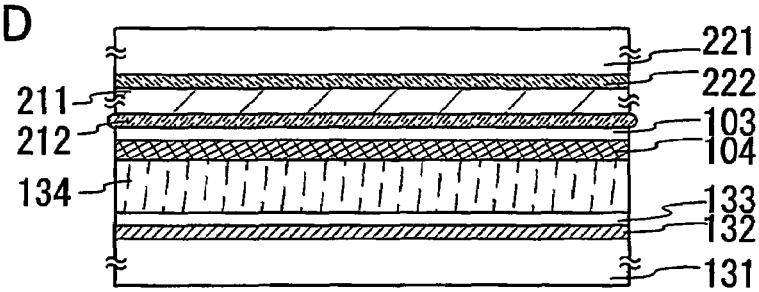

Next, as shown in FIG. 2D, a second metal film 132 and a second oxide film 133 are sequentially laminated on a third substrate 131 in the same manner as Embodiment Mode 1.

A layer 134 including a pixel is formed on the second oxide film 133.

Subsequently, the optical film manufactured in FIG. 2C, i.e., the optical filter provided on the second substrate is attached to a surface of the layer 134 including the pixel. The optical filter 104 of the optical film is attached to the surface of the layer 134 including the pixel with a second adhesive material (not shown). The same material as the first adhesive material can be used for the second adhesive material.

Figure 2E:
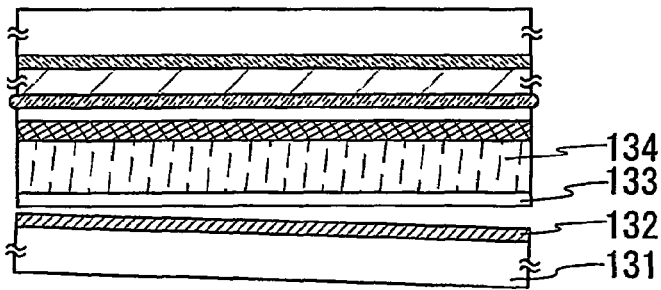

As shown in FIG. 2E, the second oxide film 133 is separated from the second metal film 132 by using a physical means in the same manner as the step shown in FIG. 2B. In accordance with the step, the third substrate 131 and the second metal film 132 are separated from the layer 134 including the pixel.

Figure 2F:
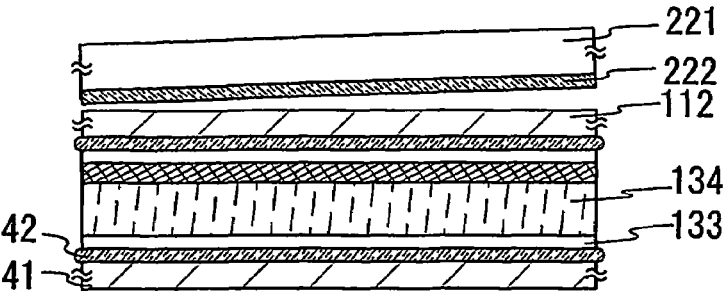

As shown in FIG. 2F, a fourth substrate 141 is attached to the surface of the second oxide film 133 by using a third adhesive material 142. A plastic substrate can be used for the fourth substrate 141 as well as the second substrate 112. The second peelable adhesive agent 222 and the second support medium 221 are next separated from the second substrate 112.

According to the above-described steps, a display device including a plastic substrate can be manufactured. That is, a display device using the optical film formed on the plastic substrate as an opposing substrate can be fabricated. As a consequence, a lightweight, thin display device having an excellent impact resistance property can be formed. In addition, a display device having a curved surface or a display device that can be varied in shape can be manufactured.

Embodiment Mode 3

The present embodiment mode explains the following steps with reference to FIGS. 3A to 3F: an optical film is transferred to a surface of a layer including a pixel, and a plastic substrate is attached thereon to fabricate an opposing substrate of a display device.

As shown in FIG. 3A, a first metal film 102 and a first oxide film 103 are sequentially formed on a first substrate 101, and an optical filter 104 is formed on the first oxide film 103 in the same manner as Embodiment Mode 1. Note that a first metal oxide film is formed between the first metal film and the first oxide film.

The first support medium 121 is attached to a surface of the optical filter 104 using a first peelable adhesive agent 122. The first substrate 101 and the first metal film 102 formed thereon are referred to as a first separation body 123. Meanwhile, the first oxide film 103 and the optical filter 104 (i.e., layers sandwiched between the first metal film 102 and the first peelable adhesive agent 122) are referred to as a first subject body 224.

Preferably, a support medium is pasted to the first substrate 101 with a peelable adhesive agent in order to prevent breakage of each substrate. When the surface of the optical filter 104 is uneven, a planarizing layer may be provided thereon.

As shown in FIG. 3B, the first separation body 123 is separated from the first subject body 224 by using a physical means. To separate the separation body easily, the pretreatment as described in Embodiment Mode 1 is preferably carried out as a previous step prior to the separation step. By conducting the pretreatment, separation can be easily caused inside the first metal oxide film, in an interface between the first metal oxide film and the first oxide film, or in an interface between the first metal oxide film and the first metal film so that the first separation body 123 can be separated from the first subject body 224 by a relatively small force.

As depicted in FIG. 3C, a second metal film 132 and a second oxide film 133 are sequentially formed on a second substrate 331 in the same manner as Embodiment Mode 1. The same substrate as the third substrate 131 employed in Embodiment Mode 1 can be used for the second substrate 331.

A layer 134 including a pixel is next formed on the oxide film 133.

The subject body 224 fabricated in FIG. 3B, i.e., the optical filter is attached to a surface of the layer 134 including the pixel. Specifically, the first oxide film 103 of the subject body 224 is attached to the surface of the layer 134 including the pixel by using a first adhesive material (not shown). The same material as the first adhesive material 111 shown in Embodiment Mode 1 can be used for the first adhesive material.

As shown in FIG. 3D, the second oxide film 133 is separated from the second metal film 132 by a physical means in the same manner as the step shown in FIG. 3B. According to the step, the second substrate 331 and the second metal film 132 are separated from the layer 134 including the pixel.

As shown in FIG. 3E, a third substrate 341 is fixed to the surface of the first oxide film 133 using a second adhesive material 342. The third substrate 341 and the second adhesive material 342 can use the same materials as the fourth substrate 141 and the first adhesive material 111 of Embodiment Mode 1, respectively. The first peelable adhesive agent 122 and the first support medium 121 are next separated from the optical filter 104.

A fourth substrate 343 is fixed to the surface of the optical filter 104 using a third adhesive material 344. The fourth substrate 343 and the third adhesive material 344 use the same materials of the fourth substrate 141 and the first adhesive material 111 of Embodiment Mode 1, respectively.

As shown in Embodiment Mode 2, a color filter may be attached to the surface of the layer including the pixel, as substitute for Embodiment Mode 1.

When a protective film is formed on the surface of the optical filter 104, a display device can be manufactured without providing the fourth substrate thereon.

According to the above-mentioned steps, a display device including the plastic substrate can be fabricated. That is, the present embodiment mode makes it possible to fabricate a display device using the optical film formed on the plastic substrate as the opposing substrate. As a consequence, a lightweight, thin display device having an excellent impact resistance property can be formed. In addition, a display device having a curved surface or a display device that can be varied in shape can be manufactured.

Embodiment Mode 4

In the present embodiment mode, a method of manufacturing a display device having optical films, which are formed according to any one of Embodiment Mode 1 to Embodiment Mode 3, on both surfaces thereof will be described referring to FIGS. 4A to 4E. Note that the present embodiment mode uses Embodiment Mode 1 by way of example.

Figure 4A:
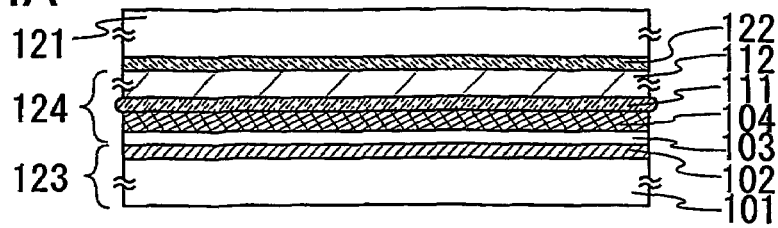
FIGS. 4A to 4E are cross sectional views explaining steps of manufacturing a display device according to the present invention.

As shown in FIG. 4A, a first metal film 102 and a first oxide film 103 are sequentially formed on a first substrate 101, and an optical filter 104 is formed on the first oxide film 103 in the same manner as Embodiment Mode 1. Note that a first metal oxide film is formed between the first metal film 102 and the first oxide film 103.

A second substrate 112 is attached to a surface of the optical filter 104 using a first adhesive material 111, and a first support medium 121 is attached to a surface of the second substrate by using a first peelable adhesive agent 122. The first substrate 101 and the first metal film 102 formed thereon are referred to as a first separation body 123. Meanwhile, the first oxide film 103 and the optical filter 104 (i.e., layers sandwiched between the first metal film 102 and the first peelable adhesive agent 122) are referred to as a first subject body 124.

Figure 4B:
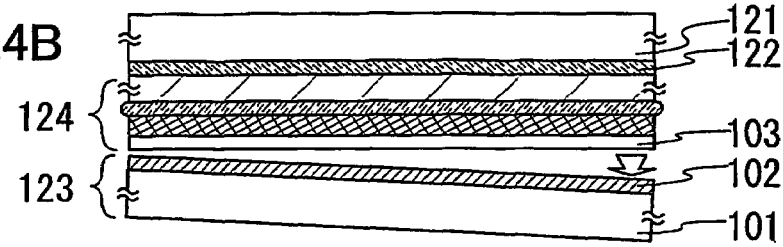

Subsequently, as shown in FIG. 4B, the separation body 123 is separated from the subject body 124 by a physical means as well as Embodiment Mode 1. To separate the separation body easily, a pretreatment is preferably carried out as a previous step prior to the separation step. By conducting the pretreatment, separation can be easily caused inside the first metal oxide film, in an interface between the first metal oxide film and the first oxide film, or in an interface between the first metal oxide film and the first metal film so that the first separation body 123 can be separated from the first subject body 124 by a relatively small force.

In accordance with the above-mentioned steps, the optical film can thus be formed. That is, the optical filter 104 can be provided on the second substrate 112.

Figure 4C:
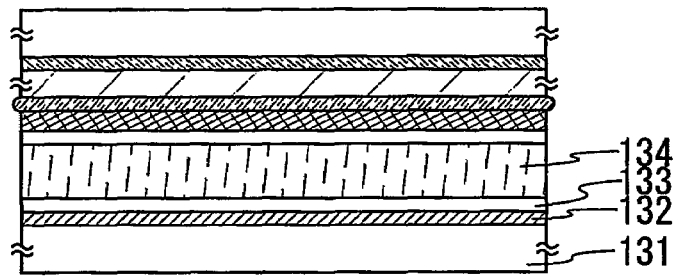

As depicted in FIG. 4C, a second metal film 132 and a second oxide film 133 are sequentially formed on a third substrate 131 in the same manner as Embodiment Mode 1.

A layer 134 including a pixel is formed on the second oxide film 133.

The subject body 124 that is fabricated in FIG. 4B, i.e., the optical film is attached to a surface of the layer 134 including the pixel. Specifically, the first oxide film 103 of the subject body 124 is attached to the surface of the layer 134 including the pixel by using a second adhesive material (not shown). The same material as the first adhesive material 111 can be used for the second adhesive material.

Figure 4D:
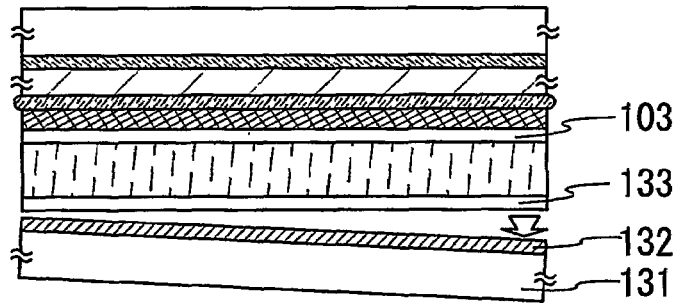
Figure 4E:
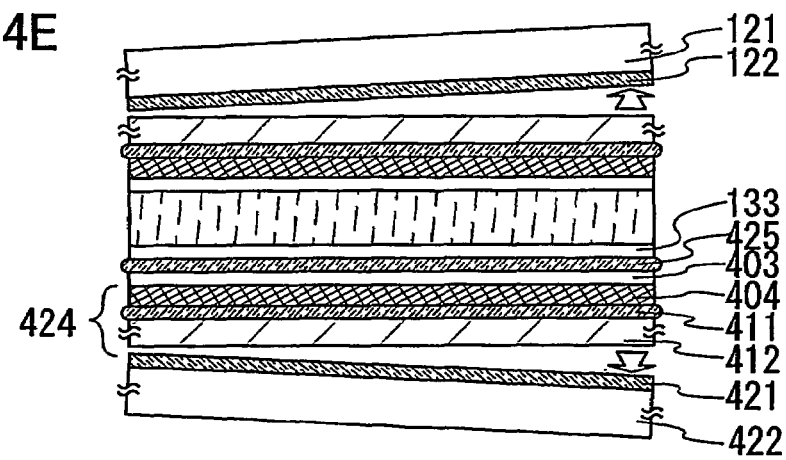

As shown in FIG. 4D, the second oxide film 133 is separated from the second metal film 132 by a physical means in the same manner as the steps shown in FIG. 4B. According to the step, the third substrate 131 and the second metal film 132 are separated from the layer 134 including the pixel.

A second subject body 224, which is fabricated according to the steps shown in FIGS. 4A and 4B, is attached to the surface of the second oxide film 133 by using a fourth adhesive material 425. The second subject body 424 is composed by laminating a third oxide film 403, a second optical filter 404, a third adhesive material 411, a fourth substrate 412, a second peelable adhesive agent 421, and a second support medium 422 as well as the first subject body 124. The materials for the respective layers of the first subject body 124 can be used as respective layers of the second subject body. Thereafter, the second peelable adhesive agent 421 and the second support medium 422 are separated from the fourth substrate 412. Further, the first peelable adhesive agent 122 and the first support medium 121 are separated from the second substrate 112.

Although the display device is fabricated by using the optical films manufactured according to Embodiment Mode 1, the present embodiment mode is not particularly limited thereto. The display device can be manufactured by properly transferring the optical film fabricated according to Embodiment Mode 2 or Embodiment Mode 3 as an opposing substrate.

According to the invention, a display device including the plastic substrate can be fabricated. As a consequence, a lightweight, thin display device having an excellent impact resistance property can be formed. In addition, a display device having a curved surface or a display device that can be varied in shape can be manufactured.

Further, the display device having the optical films on both surfaces thereof can be manufactured in accordance with the present embodiment mode, which allows the display device to display images on both surfaces thereof.

Embodiment Mode 5

In the present embodiment mode, a method of manufacturing a display device by using different kinds of substrates will be described with reference to FIGS. 5A to 5D.

Figure 5A:
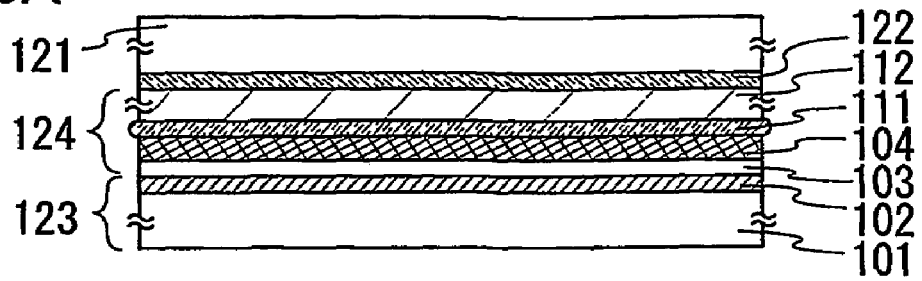
FIGS. 5A to 5D are cross sectional views explaining steps of manufacturing a display device according to the present invention.

As shown in FIG. 5A, a first metal film 102 and a first oxide film 103 are sequentially formed on a first substrate 101, and an optical filter 104 is formed thereon in the same manner as Embodiment Mode 1. Note that a first metal oxide film is formed between the first metal film 102 and the first oxide film 103.

A second substrate 112 is attached to the surface of the optical filter 104 using a first adhesive material 111, and a first support medium 121 is attached thereto by using a first peelable adhesive agent 122. The first substrate 101 and the first metal film 102 formed thereon are, herein, referred to as a first separation body 123. Meanwhile, the first oxide film 103, the optical filter 104, the first adhesive material 111, and the second substrate 112 (i.e., layers sandwiched between the metal film 102 and the first peelable adhesive agent 122) are referred to as a first subject body 124.

Figure 5B:
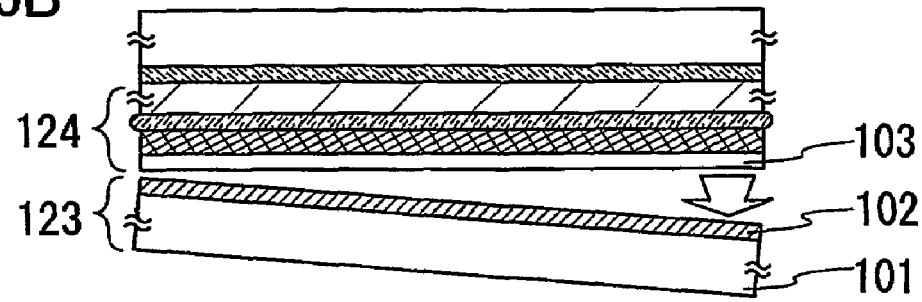

Subsequently, as shown in FIG. 5B, the separation body 123 is separated from the subject body 124 by a physical means as well as Embodiment Mode 1. To separate the separation body easily, the pretreatment as described in Embodiment Mode 1 is preferably carried out as a previous step prior to the separation step. By conducting the pretreatment, separation can be easily caused inside the first metal oxide film, in an interface between the first metal oxide film and the first oxide film, or in an interface between the first metal oxide film and the first metal film so that the first separation body 123 can be separated from the first subject body 124 by a relatively small force.

In accordance with the above-mentioned steps, the optical film can thus be formed. That is, the optical filter 104 can be provided on the second substrate 112.

Figure 5C:
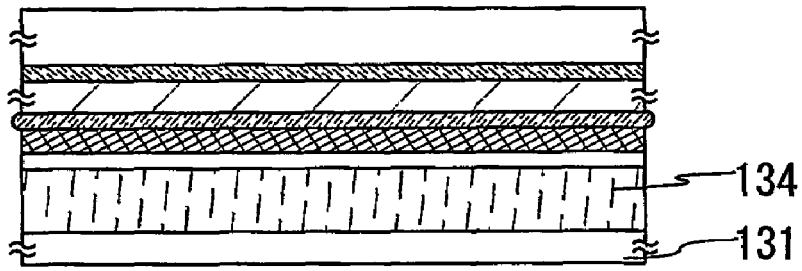

A layer 134 including a pixel is next formed on a third substrate 131 as depicted in FIG. 5C. The third substrate 131 of Embodiment Mode 1 can be used for the third substrate 131 of the present embodiment mode. Preferably, a polished substrate is used as the third substrate such that a display device formed later can be fabricated thinly. In addition, a fourth substrate may be attached to the surface of the third substrate. In this case, when a plastic substrate is used for the fourth substrate as well as the second substrate 112 of Embodiment Mode 1, the impact resistance properties can be further improved.

The third substrate as shown in Embodiment Mode 1 is a heat-resistant substrate, and typically, a glass substrate, a quartz substrate, a ceramic substrate, a silicon substrate, a metal substrate, and the like can be used for the third substrate.

Subsequently the first subject body 124 manufactured in FIG. 5B, i.e., the optical film is attached to a surface of the layer 134 including the pixel. Concretely, the first oxide film 103 of the first subject body 124 is attached to the surface of the layer 134 including the pixel by using a second adhesive material (not shown). The same material as the first adhesive material 111 can be used for the second adhesive material.

Figure 5D:
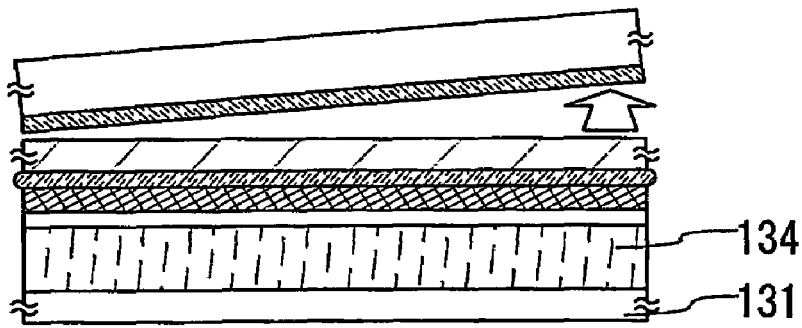

As shown in FIG. 5D, the first peelable adhesive agent 122 and the first support medium 121 are separated.

According to the above-mentioned steps, the display device having multiple kinds of substrates can be manufactured.

Although the optical film is, herein, formed according to Embodiment Mode 1, it can be fabricated in accordance with Embodiment Mode 2 or Embodiment Mode 3 in place of Embodiment Mode 1.

According to the invention, a display device including the optical film that is formed using the plastic substrate can be fabricated. Consequently, a lightweight, thin display device having an excellent impact resistance property can be formed.

Since the display device is manufactured using plural kinds of substrates in the present embodiment mode, it is possible to select a suitable substrate depending on process conditions. In addition, since the plastic substrate is used, a display device having superior impact resistance property can be manufactured.

Embodiment Mode 6

With respect to any one of Embodiment Mode 1 through Embodiment Mode 3, a step of causing a separation between a separation body and a subject body more easily will be described in the present embodiment mode. The embodiment mode uses Embodiment Mode 1 for the sake of explanation referring to FIGS. 1A to 1E. Note that the present embodiment mode can be applicable to any one of Embodiment Mode 2 through Embodiment Mode 5, in place of Embodiment Mode 1.

After forming the first metal film 102 and the first oxide film 103 on the first substrate 101, the substrate is heated. Thereafter, the optical film 104 is formed thereon. By conducting the heat treatment, the first metal film 102 can be separated from the first oxide film 103 easily with a smaller physical force. In this case, the heat treatment can be carried out in the temperature range that is withstood by the first substrate, typically, in the range of 100 to 600° C., preferably, in the range of 150 to 500° C.

As substitute for the heat treatment, laser beam may be irradiated from the side of the first substrate 101. Also, a combined treatment of the heat treatment and laser beam irradiation treatment may be performed.

A continuous wave solid-state laser or a pulsed solid-state laser can be used here. As the continuous wave solid-state laser or the pulsed solid-state laser, one or more of the following various kinds of lasers can typically be used: a YAG laser; a $YVO_4$ laser; a YLF laser; a $YAlO_3$ laser; a glass laser; a ruby laser; an alexandrite laser; and a Ti:sapphire laser. It is preferable to use the second harmonic wave through fourth harmonic wave of fundamental waves in the case of using the solid-state laser. Furthermore, as the other continuous wave lasers or pulsed lasers, there are an excimer laser; an Ar laser; and a Kr laser.

The laser beam can be irradiated to the first metal film 102 from a side of the substrate, from a side of the first oxide film 103, or from both sides of the substrate and the oxide film.

Further, a beam shape of the laser beam may be a circular shape, a triangular shape, a square shape, a polygonal shape, an elliptical shape, or a linear shape. The size of the laser beam is not particularly limited, and may be from several microns to several meters (that may also have either a doted shape or a planer shape). Furthermore, in the above-mentioned oxidizing step, a portion to be irradiated with the laser beam may be overlapped with a region where has been irradiated with the laser beam immediately before the portion, or may not be overlapped therewith. In addition, it is preferable to use a laser beam having a wavelength of from 10 nm to 1 mm, more preferably, from 100 nm to 10 μm.

Consequently, the optical film manufactured in the embodiment mode can be separated from the first substrate with a smaller physical force, thereby improving yield and reliability of a display device having the optical film.

Embodiment Mode 7

With respect to any one of Embodiment Mode 1 through Embodiment Mode 5, a step of causing separation between a separation body and a subject body more easily will be described in the present embodiment mode. Note that the present embodiment mode can be applicable to any one of Embodiment Mode 2 through Embodiment Mode 5, besides Embodiment Mode 1.

In the embodiment mode, a heat treatment is carried out after forming an optical filter.

After forming a first metal film 102, a first oxide film 103, and an optical filter 104 on a first substrate, the resultant first substrate is heated. Thereafter, a second substrate 112 is attached to the optical filter 104 using a first adhesive material 111 in Embodiment Mode 1. Meanwhile, a first support medium 121 is attached to the optical filter 104 by using a first peelable adhesive agent 122 in Embodiment Mode 2.

By conducting the heat treatment, the first metal film 102 can be separated from the first oxide film 103 by a smaller physical force. At this moment, the heat treatment can be carried out in the temperature range that is withstood by the first substrate or the optical filter, typically, in the range of 150 to 300° C., preferably, in the range of 200 to 250° C.

As substitute for the heat treatment, laser beam may be irradiated from the side of the first substrate 101 as well as Embodiment Mode 6. Also, a combined treatment of the heat treatment and laser beam irradiation treatment can be performed.

The optical film manufacture in the embodiment mode can be separated from the first substrate with a smaller physical force, thereby improving yield and reliability of a display device using the optical film.

Embodiment Mode 8

The present embodiment mode will describe a method of forming an optical film, which is different in the step of forming a metal oxide film as compared with Embodiment Modes 1 through 7. The present embodiment mode uses Embodiment Mode 1 for the sake of explanation.

A metal film 102 is formed on a first substrate 101 in the same manner as Embodiment Mode 1. Subsequently, a metal oxide film is formed on a surface of the metal film 102. As a method of forming the metal oxide film thereon, followings can be cited: a thermal oxidation treatment; an oxygen plasma treatment; a treatment using a strong oxidizing solution such as ozone water; and the like. By utilizing any one of the oxidizing methods, the surface of the metal film 102 is oxidized to form the metal oxide film with a thickness of from 1 to 10 nm, preferably, from 2 to 5 nm.

An oxide film 103 and an optical filter 104 are then formed on the metal oxide film in the same manner as Embodiment Mode 1. Thereafter, an optical film can be archived according to each embodiment mode.

Consequently, the metal oxide film that is a part of the separation body can be formed in the present embodiment mode, thereby forming an optical film with high yield.

Embodiment Mode 9

Figure 14A:
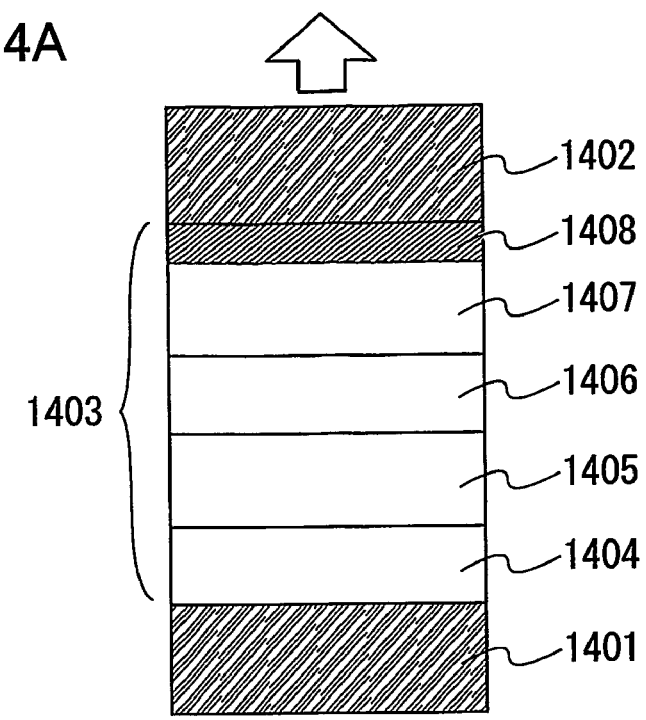
FIGS. 14A and 14B are diagrams showing structures of a light emitting element.
Figure 14B:
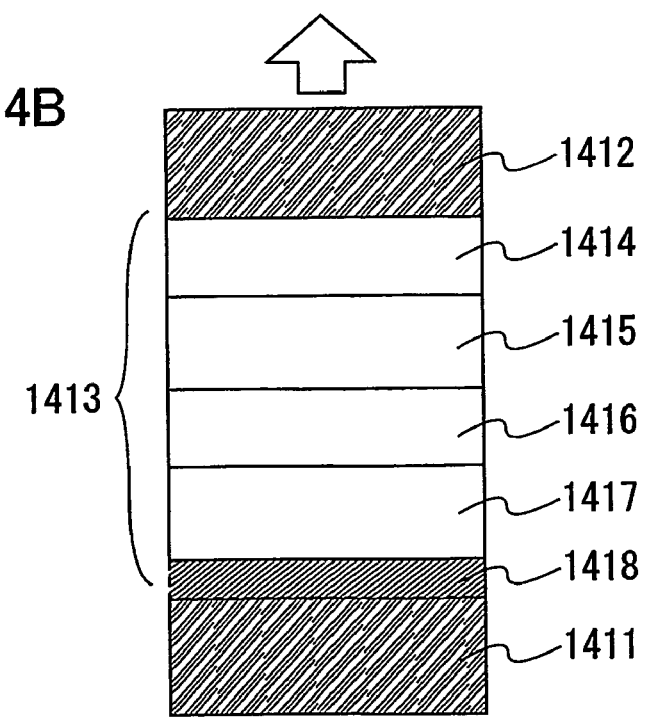

The present embodiment mode will describe a structure of a light emitting element that is applicable to any one of Embodiment Mode 1 through Embodiment Mode 8 with reference to FIGS. 14A and 14B.

A light emitting element includes a pair of electrodes (an anode and a cathode), and a layer containing a luminescent substance that is sandwiched between the anode and the cathode. First electrodes, hereinafter, represent electrodes that are provided on the sides of the second substrates in Embodiment Modes 1, 2, 4, on the side of the fourth substrate in Embodiment Mode 3, and on the side of the third substrate in Embodiment Mode 5, respectively, while second electrodes represent electrodes that are provided on substrates, which are opposite of the above-mentioned substrates, in Embodiment Mode 1 through Embodiment Mode 5, respectively.

The layer containing the luminescent substance includes at least a light emitting layer, and is formed by laminating one or more of layers having different properties with respect to carries such as a hole injecting layer, a hole transporting layer, a blocking layer, an electron transporting layer, and an electron injecting layer, along with the light emitting layer.

FIGS. 14A and 14B show examples of cross sectional structures for the light emitting element.

In FIG. 14A, a layer 1403 containing a luminescent substance is composed by sequentially laminating a hole injecting layer 1404, a hole transporting layer 1405, a light emitting layer 1406, an electron transporting layer 1407, and an electron injecting layer 1408 on a first electrode (anode) 1401. A second electrode (cathode) 1402 is provided on the electron injecting layer 1408 to complete a light emitting element. In the case where a TFT for driving the light emitting element is provided in the first electrode (anode), a p-channel TFT is used as the TFT.

Meanwhile, in FIG. 14B, a layer 1413 containing a luminescent substance is composed by sequentially laminating an electron injecting layer 1418, an electron transporting layer 1417, a light emitting layer 1416, a hole transporting layer 1415, and a hole injecting layer 1414 on a first electrode (cathode) 1411. A second electrode (anode) 1412 is provided on the hole injecting layer 1414 to complete a light emitting element. When a TFT for driving the light emitting element is provided in the first electrode (cathode), an n-channel TFT is used as the TFT.

Note that this embodiment mode is not limited thereto. For example, various types of structures can be employed for the light emitting element as follows: a structure of an anode/a hole injecting layer/a light emitting layer/an electron transporting layer/and a cathode, a structure of an anode/a hole injecting layer/a hole transporting layer/a light emitting layer/an electron transporting layer/an electron injecting layer/and a cathode, a structure of an anode/a hole injecting layer/a hole transporting layer/a light emitting layer/a hole blocking layer/an electron transporting layer/and a cathode, a structure of an anode/a hole injecting layer/a hole transporting layer/a light emitting layer/a hole blocking layer/an electron transporting layer/an electron injecting layer/and a cathode, and the like. Note that a stripe arrangement, a delta arrangement, a mosaic arrangement and the like can be cited as the arrangement of a light-emitting region, that is to say, the arrangement of a pixel electrode.

The first electrodes 1401 and 1411 are made from conductive films with light-shielding properties. In FIG. 14A, the first electrode 1401 serves as an anode, and hence, can be formed of a single layer of TiN, ZrN, Ti, W, Ni, Pt, Cr, Al, etc., a lamination layer in combination with a titanium nitride film and an aluminum-based film, or a three-layer structure of a titanium nitride film, an aluminum-based film, and another titanium nitride film.

In FIG. 14B, the first electrode 1401 serves as a cathode, and therefore, can be formed of alkali metal such as Li and Cs, alkali earth metal such as Mg, Ca, and Sr, an alloy containing the alkali metal and alkali earth metal (such as Mg:Ag and Al:Li), and rare earth metal such as Yb and Er. In the case of using an electron injecting layer made from LiF, CsF, $CaF_2$, $Li_2O$, and the like, a normal thin conductive film such as aluminum can be used as the first electrode.

The layers 1403 and 1413 containing the luminescent substances can be formed of known organic compounds such as a low molecular weight material, a high molecular weight material, and a middle molecular weight material typified by oligomer, dendrimer, and the like. Also, a light emitting material (singlet compound) that emits light (fluorescence) by singlet excitation or a light emitting material (triplet compound) that emits light (phosphorescence) by triplet excitation can be used.

Next, specific examples of materials for constituting the layers 1403 and 1413 containing the luminescent substances are shown below.

In the case of an organic compound, a porphyrin compound is effective as hole injecting materials for forming the hole injecting layers 1404 and 1414, and for example, phthalocyanine (hereinafter referred to as $H_2$-Pc), copper phthalocyanine (hereinafter referred to as Cu-Pc), and the like can be used. As for the hole injecting materials, there is also a material in which a conductive polymer compound is subjected to chemical doping such as polyethylene dioxythiophene (hereinafter referred to as PEDOT) doped with polystyrene sulfonate (hereinafter referred to as PSS), polyaniline (hereinafter referred to as PAni), and polyvinyl carbazole (hereinafter referred to as PVK). It is also effective to use a thin film made from an inorganic semiconductor such as vanadium pentoxide or an ultra-thin film made from an inorganic insulator such as aluminum oxide.

As hole transporting materials used for forming the hole transporting layers 1405 and 1415, aromatic amine-based compounds (i.e., substances having a benzene ring-nitrogen bond) are preferred. As the materials that are used widely, for example, there are N,N'-bis(3-methylphenyl)-N,N'-diphenyl-1,1'-biphenyl-4,4'-diamine (abbreviation: TPD); a derivative thereof such as 4,4'-bis[N-(1-naphthyl)-N-phenyl-amino]-biphenyl (abbreviation: α-NPD); and the like. Further, star burst aromatic -amine compounds such as 4,4',4"-tris (N, N-diphenyl-amino)-triphenylamine (abbreviation: TDATA), and 4,4',4"-tris [N-(3-methylphenyl)-N-phenyl-amino]-triphenylamine (abbreviation: MTDATA) can also be cited.

Specific examples of the light emitting materials used for forming the light emitting layers 1406 and 1416 include metal complexes such as tris(8-quinolinolate) aluminum (abbreviation: $Alq_3$), tris (4-methyl-8-quinolinolate) aluminum (abbreviation: $Almq_3$), bis(10-hydroxybenzo[h]quinolinato) beryllium (abbreviation: $BeBq_2$), bis(2-methyl-8-quinolinolate)-(4-hydroxy-biphenylyl)-aluminum (abbreviation: BAlq), bis [2-(2-hydroxyphenyl)-benzoxazolate] zinc (abbreviation: $Zn(BOX)_2$), and bis [2-(2-hydroxyphenyl)-benzothiazolate] zinc (abbreviation: $Zn(BTZ)_2$). In addition, various kinds of fluorescent dyes are effective for the material of the light-emitting layers. It is also possible to use triplet luminescent materials in which complexes include platinum or iridium as their central metal. For example, the followings are known as the triplet luminescent materials: tris(2-phenylpyridine) iridium (abbreviation: $Ir(ppy)_3$); 2,3,7,8,12,13,17,18-octaethyl-21H,23H-porphyrin-platinum (abbreviation: PtOEP); and the like.

As electron transporting materials for forming the electron transporting layers 1407 and 1417, the following metal complexes can be cited: tris(8-quinolinolate) aluminum (abbreviation: $Alq_3$); tris(4-methyl-8-quinolinolate) aluminum (abbreviation: $Almq_3$); bis(10-hydroxybenzo[h]quinolinato) beryllium (abbreviation: $BeBq_2$); bis(2-methyl-8-quinolinolate)-(4-hydroxy-biphenylyl)-aluminum (abbreviation: BAlq); bis[2-(2-hydroxyphenyl)-benzoxazolate] zinc (abbreviation: $Zn(BOX)_2$); bis[2-(2-hydroxyphenyl)-benzothiazolate] zinc (abbreviation: $Zn(BTZ)_2$); and the like. In addition to the metal complexes, the electron transporting layers use materials as follows: oxadiazole derivatives such as 2-(4-biphenyl)-5-(4-tert-butylphenyl)-1,3,4-oxadiazole (abbreviation: PBD), and 1,3-bis[5-(p-tert-butylphenyl)-1,3,4-oxadiazole-2-yl] benzene (abbreviation: OXD-7); triazole derivatives such as 3-(4-tert-butylphenyl)-4-phenyl-5-(4-biphenylyl)-1,2,4-triazole (abbreviation: TAZ) and 3-(4-tert-butylphenyl)-4-(4-ethylphenyl)-5-(4-biphenylyl)-1,2,4-triazole (abbreviation: p-EtTAZ); imidazole derivatives such as 2,2',2"-(1,3,5-benzenetriyl)tris[1-phenyl-1H-benzimidazole] (abbreviation: TPBI); and phenanthroline derivatives such as bathophenanthroline (abbreviation: BPhen) and bathocuproin (abbreviation: BCP).

As electron injecting materials used for forming the electron injecting layers 1408 and 1418, the above-mentioned electron transporting materials can be used. Besides, an ultra-thin film made from an insulator such as alkali metal halides (e.g., LiF and CsF), alkali earth halides (e.g., $CaF_2$), and alkali metal oxides (e.g., $Li_2O$) is frequently used. In addition, alkali metal complexes such as lithium acetylacetonate (abbreviation: Li(acac)) and 8-quinolinolate-lithium (abbreviation: Liq) can also be used effectively.

In the case of forming a light emitting display device according to the present embodiment mode, full color display can be performed by making the layer containing the luminescent substance to emit white light while forming a color filter, additionally. Alternatively, full color display can be performed by making a layer containing a luminescent substance to emit blue light while providing a color conversion layer and the like, additionally.

Further, colored layers emitting red, green, and blue lights, respectively, are formed in the layers 1403 and 1413 containing the luminescent substances while using color filters so as to carry out full color display. The light emitting display device having the structure exhibits high color purity of respective R, C; and B so that high definition display can be performed.

The second electrodes have polarities corresponding to the first electrodes 1401 and 1411, and are made from transparent conductive films.

In FIG. 14A, the second electrode 1402 serves as the cathode, and therefore, can be formed by laminating an ultra thin film containing alkali metal such as Li and Cs and alkali earth metal such as Mg, Ca, and Sr, and a transparent conductive film (e.g., ITO, IZO, ZnO, and the like). Or, the cathode may be formed by forming an electron transporting layer formed by co-depositing an electron transporting material with alkali metal or alkali earth metal, and laminating a transparent conductive film (e.g., ITO, IZO, ZnO, etc.) thereon.

In FIG. 14B, the second electrode 1412 serves as the anode, and therefore, is made from a transparent conductive film. In FIG. 14A, the first electrode serves as the anode, and therefore, is formed using a transparent conductive material such as indium-tin oxide (ITO), and indium-zinc oxide (IZO).

In FIG. 14A, when the first electrode 1411 (anode) is formed of a transparent conductive film, typically, a transparent conductive material such as indium-tin oxide (ITO), indium-zinc oxide (IZO), and indium-tin oxide containing silicon oxide (ITSO), light can be emitted both toward the first electrode and the second electrode.

In FIG. 14B, light can be emitted both toward the first electrode and the second electrode by using the structures as follows. The first electrode 1401 (cathode) is formed of a transparent conductive film, typically, a layer formed by laminating an ultra-thin film containing an alkali metal (e.g., Li and Cs) together with an alkali earth metal (e.g., Mg, Ca, and Sr) and a transparent conductive film (ITO, IZO, ZnO, etc.). Or, an electron injecting layer is formed by co-depositing an electron transporting material with an alkali metal or an alkali earth metal, and a transparent conductive film (ITO, IZO, ZnO, etc.) is laminated thereon.

The light emitting elements shown in the embodiment mode emit light toward the second electrodes 1402 and 1412 (in the direction denoted by arrows in the drawing), respectively.

Embodiment 1

Steps of manufacturing a light emitting display device that corresponds to one embodiment of the display device according to the present invention will be explained with reference to FIGS. 6A and 6B, FIGS. 7A and 7B, and FIGS. 8A and 8B. A color filter is used as a representative example of the optical filter in the present embodiment. Note that a color conversion filter, a hologram color filter, and the like can be used in place of the color filter.

Figure 6A:
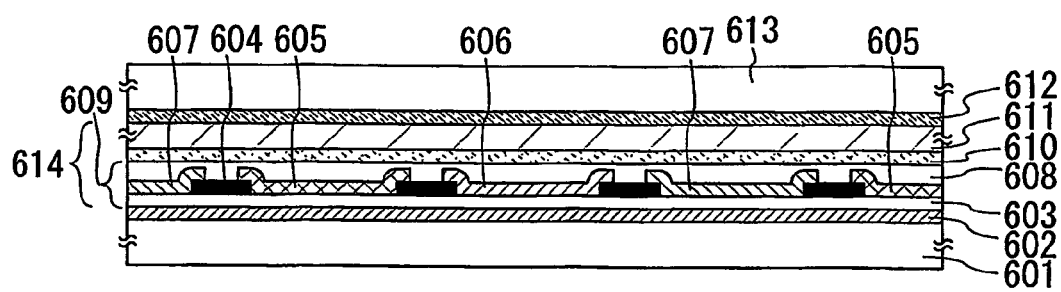
FIGS. 6A and 6B are cross sectional views explaining steps of manufacturing a display device according to the present invention.

As shown in FIG. 6A, a separation layer is formed over a glass substrate (a first substrate 601). In the embodiment, AN100 is used as the glass substrate. A first metal film 602, e.g., a molybdenum film (with a thickness of from 10 to 200 nm, preferably, from 50 to 75 nm) is formed on the glass substrate by sputtering. Subsequently, a first oxide film 603, i.e., a silicon oxide film (with a thickness of from 10 to 400 nm, preferably, from 75 to 150 nm), is laminated thereon. Upon lamination, a first metal oxide film (i.e., a molybdenum oxide film) is formed between the first metal film 602 and the first oxide film 603. In the subsequent separation step, separation will be caused inside the first molybdenum oxide film; in an interface between the first molybdenum oxide film and the first silicon oxide film; or in an interface between the first molybdenum oxide film and the first molybdenum film.

Figure 6B:
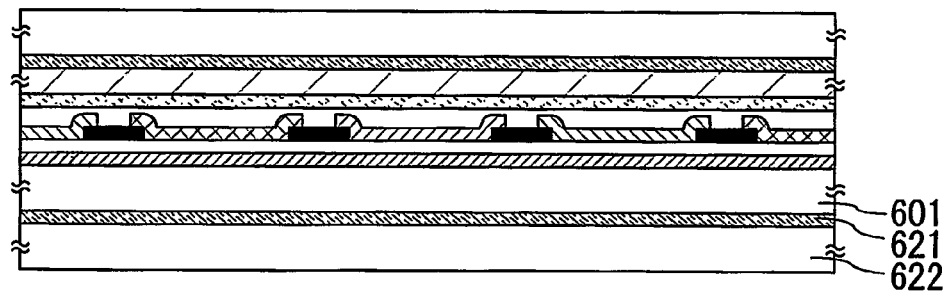

As shown in FIG. 6B, a color filter 609 is next formed on the first oxide film 603. As a method of manufacturing the color filter, the following known methods can be employed: an etching method using a colored resin; a color resist method using color resist; a dyeing method; an electrodeposition method; a micelle electrolytic method; an electrodeposition transfer method; a film diffusion method; an ink jet method (a droplet discharging method); a silver-salt coloring method; and the like.

In the present embodiment, a color filter is formed by the etching method using a photosensitive resin in which pigments are dispersed. Firstly, a photosensitive acrylic resin in which a black pigment is dispersed is applied on the first oxide film 603 by application. The acrylic resin is dried, baked temporarily, and subsequently, is exposed and developed. Thereafter, the acrylic resin is heated at a temperature of 220° C. to be cured so that a black matrix 604 with a thickness of from 0.5 to 1.5 µm is formed. Subsequently, a photosensitive acrylic resin in which a red pigment is dispersed, a photosensitive acrylic resin in which a green pigment is dispersed, and a photosensitive acrylic resin in which a blue pigment is dispersed are applied over the substrate by application, respectively. Each photosensitive acrylic resin is subjected to the same steps of forming the black matrix so that a red colored layer 605 (hereinafter, referred to as a colored layer R), a green colored layer 606 (hereinafter, referred to as a colored layer G), and a blue colored layer 607 (hereinafter, referred to as a colored layer B) are formed to have thicknesses of from 1.0 to 2.5 µm, respectively. Afterwards, an organic resin is applied over the resultant substrate to form a protective film (a planarizing layer) 608, thereby achieving a color filter 609.

In the present specification, the colored layer R represents a colored layer that transmits red light (having a peak wavelength in the vicinity of 650 nm) therethrough. The colored layer G represents a colored layer that transmits green light (having a peak wavelength in the vicinity of 550 nm) therethrough. The colored layer B represents a colored layer that transmits blue light (having a peak wavelength in the vicinity of 450 nm) therethrough.

A second substrate (a plastic substrate) 611 is attached to the protective film (planarizing layer) 608 by using a first adhesive material 610. As for the first adhesive material 610, an epoxy resin that is a light curing adhesive material is employed. A polycarbonate film is used as the second substrate 611. The oxide film formed on the surface of the color filter, the color filter, the organic resin layer, and the plastic substrate are, herein, referred to as a substrate 614 having a color filter.

Subsequently, a pretreatment is performed to carry out a separation treatment easily, although not shown in the drawings. By using a scriber device, a hard needle is moved while applying the pressure with press force of from 0.1 mm to 2 mm so as to remove edges of the substrate in the present embodiment. In this case, the first metal film 602 is separated from the first oxide film 603. By reducing the adhesiveness selectively (partly) in advance in the pretreatment, poor separation can be prevented, which results in the improved yield.

A first support medium 613 is attached to a surface of the second substrate 611 by using a first peelable adhesive agent 612. A two-sided tape is used as the first peelable adhesive agent 612, whereas a quartz substrate is used as the first support medium 613.

Next, as shown in FIG. 6B, a second support medium 622 is attached to the first substrate 601 using a second peelable adhesive agent 621. A two-sided tape is used as the second peelable adhesive agent, whereas a quartz substrate is used as the second support medium as well as the first support medium.

Figure 7A:
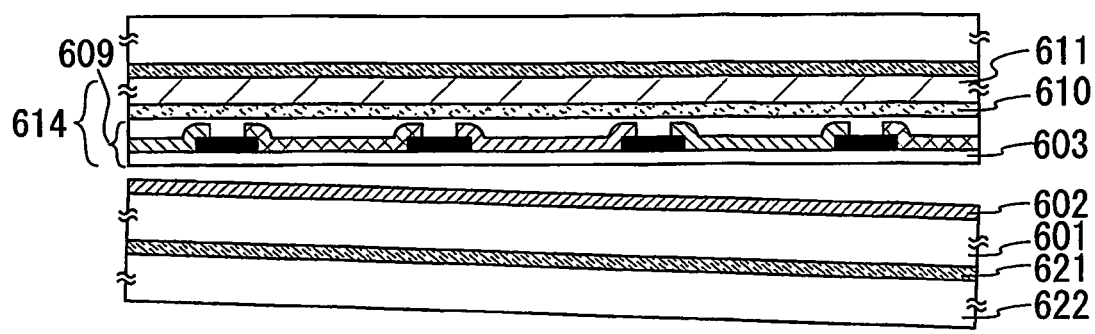
FIGS. 7A and 7B are cross sectional views explaining steps of manufacturing a display device according to the present invention.

As shown in FIG. 7A, the first substrate 601 is next separated from the substrate 614 having the color filter. Concretely, the first metal film 602 is separated from the first oxide film 603 by a physical means. The separation step can be performed by a relatively small force (for example, load with use of a member, hand power, gas pressure applied from a nozzle, and ultrasonic waves, and the like). In the present embodiment, a part of a member having a sharp end such as a wedge is inserted between the first metal film 602 and the first oxide film 603 to separate the two layers. Thus, the substrate 614 having the color filter, which is formed on the first oxide film 603, can be separated from the first substrate 601 and the first metal film 602. If the adhesive agent remains on the surface of the first oxide film 603, poor separation might be caused. Therefore, the surface of the first oxide film 603 is preferably washed by O$_2$ plasma irradiation, ultraviolet ray irradiation, ozone cleaning, and the like.

According to the above steps, the color filter 609 is formed over the plastic substrate through the organic resin that is the first adhesive material 610. Note that, the first oxide film 603 is formed on the surface of the color filter.

Figure 7B:
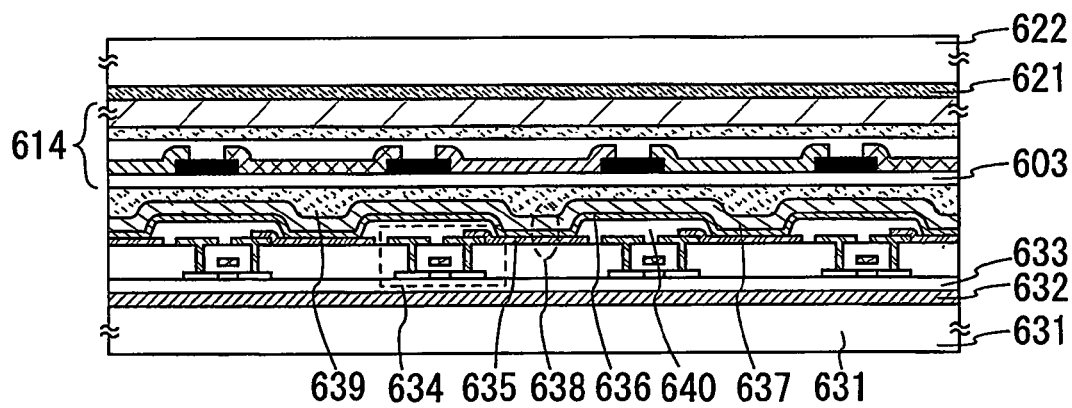

As shown in FIG. 7B, a second metal film 632 and a second oxide film 633 are formed on a third substrate 631. The second metal film 632 and the second oxide film 633 can use the same materials and structures as those of the first metal film 602 and the first oxide film 603, respectively. In the present embodiment, a tungsten film is formed as the second metal film 632 by sputtering to have a thickness of from 10 to 200 nm, preferably, from 50 to 75 nm. A silicon oxide film is formed as the second oxide film 633 by sputtering to have a thickness of form 20 to 800 nm, more preferably, 200 to 300 nm.

A light emitting element is next formed on the second oxide film 633 by a known method. A semiconductor element for driving the light emitting element is, herein, provided. As for the semiconductor element, a TFT 634 including a crystalline semiconductor film, which is formed by a known method (e.g., solid phase growth, laser crystallization, crystallization using catalytic metal, and the like), is formed. The TFT 634 is formed as follows: An amorphous silicon film is formed, and doped with a metal element such as nickel, iron, cobalt, platinum, titanium, palladium, copper, and iridium. The resultant amorphous semiconductor film is crystallized by heating to form a crystalline semiconductor film. The crystalline semiconductor film is patterned to form a semiconductor region having a predetermined shape so that a TFT having the semiconductor region as an active region is achieved. A structure of the TFT 634 is not particularly limited, and it may be either a top-gate TFT (typically, a planar TFT) or a bottom-gate TFT (typically, an inverted-stagger type TFT). Alternatively, an amorphous semiconductor film or a microcrystalline semiconductor film can be used rather than the crystalline semiconductor film. Also, an organic semiconductor transistor, a diode, an MIM element, and the like can be employed for the semiconductor element, as substitute for the TFT.

A conductive film connecting to the TFT 634 is formed and etched to have a pixel size so that a first electrode 635 is formed. The first electrode 635 is formed using a transparent conductive film, and TiN is, herein, used by way of example. An insulator 640 (that is also referred to as a bank, a partition wall, a barrier, an embankment, etc.) for covering edges of the first electrode 635 (and a wiring) is formed by a known method such as CVD, PVD, and application. The insulator 640 can be made from inorganic materials (e.g., silicon oxide, silicon nitride, silicon oxynitride, etc.); photosensitive or nonphotosensitive organic materials (e.g., polyimide, acrylic, polyamide, polyimide amide, resist, benzocyclobutene, and the like); or a lamination thereof.

A layer 636 containing a luminescent substance is next formed by vapor deposition, application, ink jet, and the like. The layer 636 containing the luminescent substance is formed of layers combination with a hole injecting layer, a hole transporting layer, an electron injecting layer, and an electron transporting layer together with a light emitting layer. Also, any known structure may be employed. The material for the light emitting layer may be either organic materials or inorganic materials. In the case of using the organic materials, either high molecular weight materials or low molecular weight materials can be employed. Preferably, degasification is performed by vacuum heating prior to forming the layer 636 containing the luminescent substance to improve the reliability. When using vapor deposition, for example, vapor deposition is carried out in a film formation chamber, which is vacuum evacuated up to a level of $5 \times 10^{-3}$ Torr (0.665 Pa) or less, preferably, in the range of from $10^{-4}$ to $10^{-6}$ Pa.

A second electrode 637 is then formed on the layer 636 containing the luminescent substance. The second electrode is made from a transparent conductive film, and an ultra thin film of an aluminum-lithium alloy is, for example, used in the embodiment.

The first electrode 635, the layer 636 containing the luminescent substance, and the second electrode 637 are collectively referred to as a light emitting element 638.

As shown in FIG. 7B, the substrate 614 having the color filter and the second electrode 637 are attached to each other using a sealing material 639. The sealing material 639 uses an ultraviolet curing resin in the embodiment.

Figure 8A:
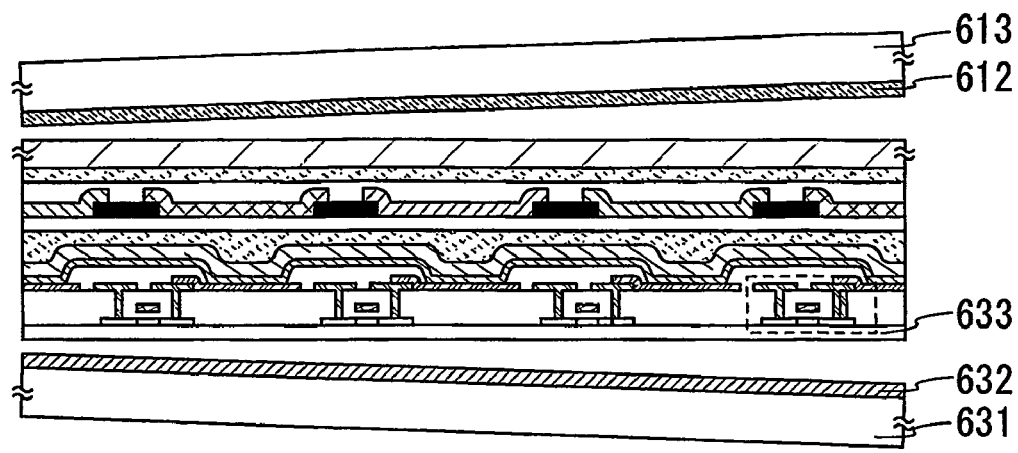
FIGS. 8A and 8B are cross sectional views explaining steps of manufacturing a display device according to the present invention.

As shown in FIG. 8A, the second metal film 632 and the third substrate 631 are removed from the second oxide film 633, as shown in FIG. 8A. Also, the first peelable adhesive agent 612 and the first support medium 613 are removed from the third substrate 631.

Figure 8B:
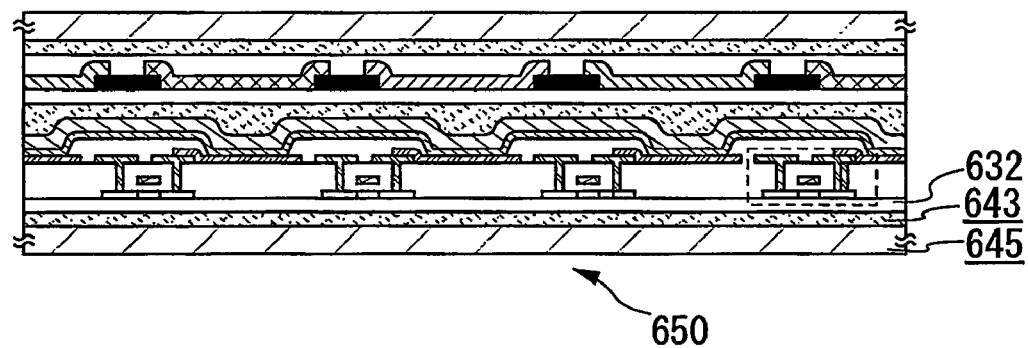

As shown in FIG. 8B, a fourth substrate 645 is attached to the second oxide film 633 with a third adhesive material 643.

Any one of Embodiment Modes 2 through 9 can be applied to the present embodiment, in place of Embodiment Mode 1.

According to the embodiment, the color filter can be formed on the plastic substrate. In addition, when an optical film such as a polarizing plate, a retardation plate, and a light diffusing film is formed using the color filter, an optical film integrated with plural properties can be achieved.

Further, a display device having the optical film that includes the plastic substrate can be fabricated, and hence, a lightweight, thin light emitting display device having an excellent impact resistance property can be formed. Furthermore, a light emitting display device having a curved surface or a light emitting display device that can be varied in shape can be fabricated.

The light emitting display device manufacturing in the embodiment comprises a structure as follows: the layer including the light emitting element or the semiconductor element and the substrate having the color filter are formed separately through different steps, and they are attached to each other after completion. By utilizing the structure, the yield of the light emitting element or the semiconductor element and the yield of the optical film can be controlled individually, thereby suppressing reduction in the yield of the entire light emitting display device.

In addition, the steps of manufacturing an active matrix substrate and the steps of manufacturing the substrate having the color filter can be run simultaneously, thereby reducing the manufacturing lead time for the display device.

Embodiment 2

Steps of manufacturing a liquid crystal display device corresponding to one embodiment of the display device in the invention will be described with reference to FIGS. 9A to 9C, FIGS. 10A and 10B, and FIGS. 11A and 11B. In the present embodiment, a color filter is used as a representative example of an optical filter. Note that a color conversion filter, a hologram color filter, and the like can be used, in place of the color filter.

Figure 9A:
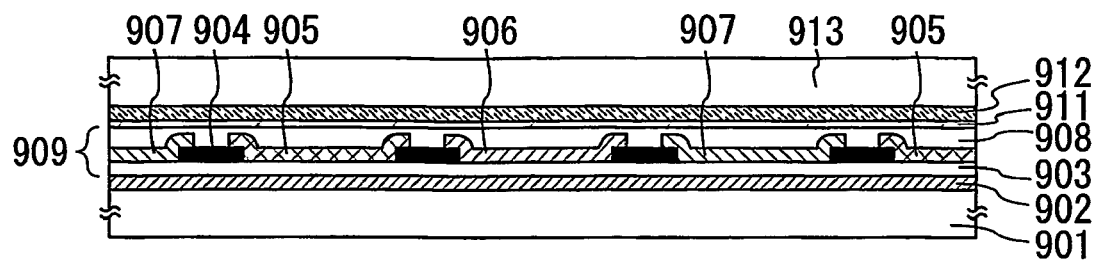
FIGS. 9A to 9C are cross sectional views explaining steps of manufacturing a display device according to the present invention.

As shown in FIG. 9A, a separation layer is formed on a glass substrate (a first substrate 901) in the same manner as Embodiment 1. AN100 is, herein, used as the glass substrate. A first metal film 902, e.g., a molybdenum film (with a thickness of from 10 to 200 nm, preferably, from 50 to 75 nm) is formed on the glass substrate by sputtering, and a first oxide film 903, e.g., a silicon oxide film (with a thickness of from 20 to 800 nm, preferably, from 200 to 300 nm), is laminated thereon. Upon laminating the first oxide film, a first metal oxide film (e.g., a molybdenum oxide film) is formed between the first metal film 902 and the first silicon oxide film 903. In the subsequent separation step, separation will be caused inside the first molybdenum oxide film, in an interface between the first molybdenum oxide film and the first silicon oxide film, or in an interface between the first molybdenum oxide film and the first molybdenum film.

Figure 9B:
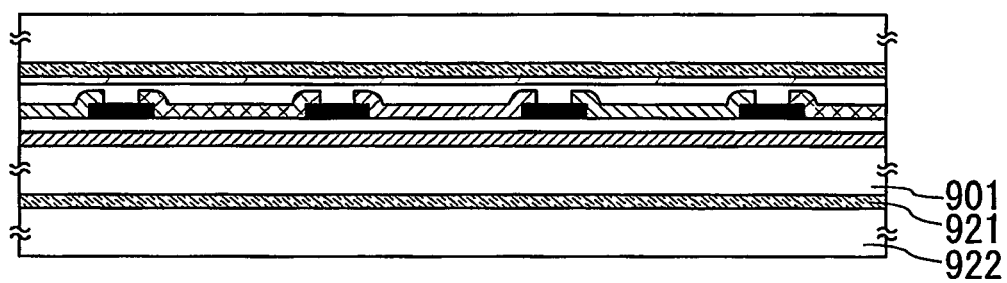

A color filter 909 is next formed on the first oxide film 903 as shown in FIG. 9B. In the embodiment, a black matrix 904 is formed to have a thickness of 0.5 to 1.5 μm by etching with use of a photosensitive resin in which a pigment is dispersed. Subsequently, a red colored layer 905 (hereinafter, referred to as a colored layer R), a green colored layer 906 (hereinafter, referred to as a colored layer G), and a blue colored layer 907

(hereinafter, referred to as a colored layer B) are formed to have thicknesses of from 1.0 to 2.5 µm, respectively, by etching with use of photosensitive resins in which pigments of respective colors are dispersed. Thereafter, a protective film (a planarizing layer) 908 is formed by applying an organic resin to complete the color filter 909.

A conductive film 911, which will serve as a pixel electrode (hereinafter referred to as a first pixel electrode), is formed on the color filter 909. The first pixel electrode is, herein, made from a transparent conductive film, typically, ITO.

A pretreatment for performing the separation step easily is carried out in the same manner as Embodiment 1, though not shown in the drawings.

A first support medium 913 is attached to a surface of the first pixel electrode 911 using a first peelable adhesive agent 912. A two-sided tape is, herein, used as the first peelable adhesive agent 912, while a quartz substrate is used as the first support medium 913.

As shown in FIG. 9B, a second support medium 922 is attached to the first substrate 901 by using a second peelable adhesive agent 921. A two-sides tape is used as the second peelable adhesive agent, while a quartz substrate is used as the second support medium as well as the first support medium.

Figure 9C:
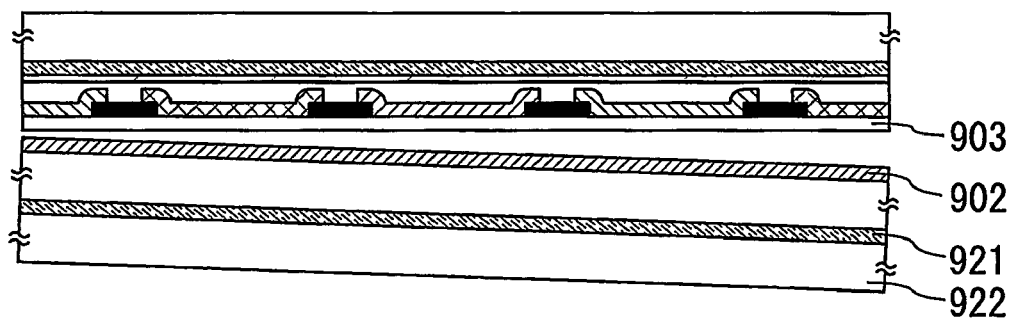

As shown in FIG. 9C, the color filter 909 is separated from the first substrate 901 in the same manner as Embodiment 1.

Figure 10A:
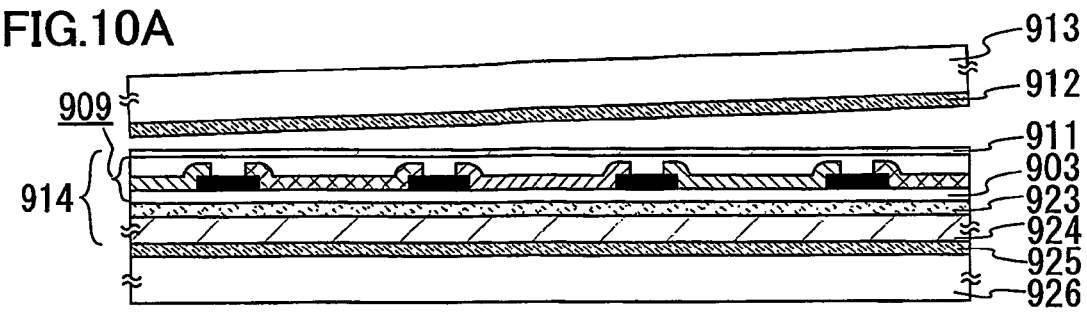
FIGS. 10A and 10B are cross sectional views explaining steps of manufacturing a display device according to the present invention.

As shown in FIG. 10A, a second substrate 924 is attached to the surface of the first oxide film 903 using a first adhesive material 923. The first adhesive material 923 uses a light curing adhesive material while the second substrate 924 uses a PEN substrate. According to the above steps, an optical film 914 including the color filter provided on the PEN substrate that is a plastic substrate can be formed.

Subsequently, a third support medium 926 is attached to a surface of the second substrate 924 with a third peelable adhesive agent 925. A tow-sided tape is used for the third peelable adhesive agent 925 whereas a quartz substrate is used for the third support medium 926 in the embodiment.

The first support medium 913 and the first peelable adhesive agent 912 are separated from the first conductive film 911. If the adhesive agent remains on the surface of the first conductive film 911, poor separation might be caused. Therefore, the surface thereof is preferably washed by $O_2$ plasma irradiation, ultraviolet ray irradiation, ozone cleaning, etc. so as to remove the residue. To remove moisture absorbed in the entire plastic substrate, vacuum heating may be carried out. In this case, the vacuum heating should be performed within an allowable temperature limit of plastic.

According to the above steps, the color filter 909 is formed over the plastic substrate (second substrate) through the organic resin, which is the first adhesive material 923. The first oxide film 903 is interposed between the color filter and the organic resin. The color filter, the oxide film formed on the surface of the color filter, the organic resin layer, and the plastic substrate are, herein, collectively referred to as a substrate 914 having the color filter.

Figure 10B:
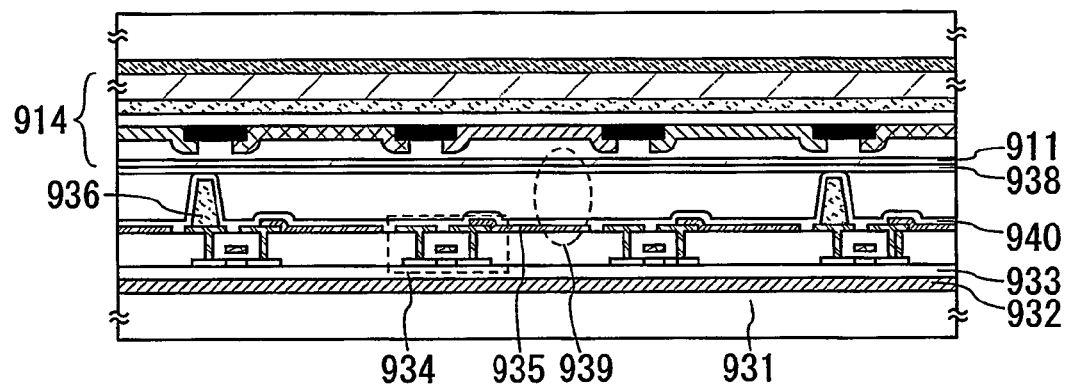

As shown in FIG. 10B, a first alignment film 938 is formed on the surface of the first pixel electrode 911. The alignment film uses an alignment film that is formed by rubbing polyimide in the present embodiment. Alternatively, an alignment film that is formed by oblique deposition using silicon oxide or a photo-alignment film can be used.

A second metal film 932 and a second oxide film 933 are next formed on a third substrate 931. As for the third metal film 932, a tungsten film is formed by sputtering to have a thickness of 10 to 200 nm, preferably, 50 to 75 nm. As for the second oxide film 933, a silicon oxide film is formed by sputtering to have a thickness of 150 to 200 nm.

A liquid crystal element is formed on the second oxide film 933 by a known method. Also, a semiconductor element for driving the liquid crystal element is provided in the embodiment. A TFT 934 using the crystalline semiconductor film as described in Embodiment 1 is used as the semiconductor element.

A conductive film made from ITO that serves as a second pixel electrode 935 is connected to the TFT 934. A liquid crystal element 939 includes the first pixel electrode 911, the second pixel electrode 935, and a liquid crystal material, which will be filled between the electrodes later.

Next, a spacer 936 is formed on the layer on which the TFT 934 is provided. The spacer is formed as follows: an organic resin is applied and etched in a predetermined shape, typically, a pillar shape or a columnar shape.

A second alignment film 940 is formed on the surfaces of the TFT 934, the second electrode 935, and the spacer 936. An alignment film formed by rubbing polyimide is used for the second alignment film as well as the first alignment film.

Thereafter, the substrate 914 having the color filter and the layer with the TFT and the second pixel electrode formed thereon are attached to each other by using a first sealing material (not shown). Specifically, the first alignment film 938 and the second alignment film 940 are adhered to each other with the first sealing material.

Figure 11A:
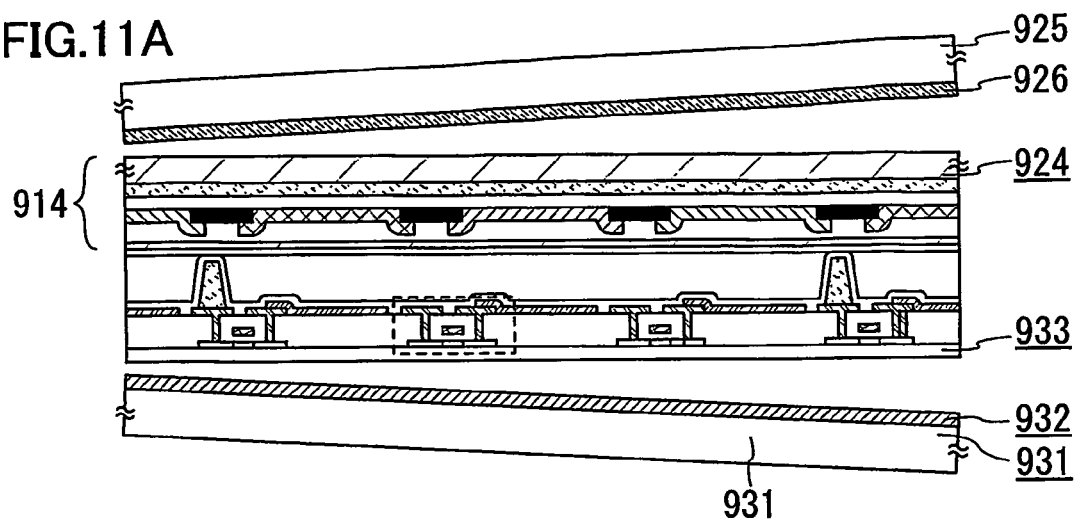
FIGS. 11A and 11B are cross sectional views explaining steps of manufacturing a display device according to the present invention.

As shown in FIG. 11A, the second metal film 932 and the third substrate 931 are removed from the second oxide film 933. Subsequently, a fourth substrate 942 is attached to the second oxide film. Further, the third peelable adhesive agent 925 and the third support medium 926 are removed from the second substrate 924.

Figure 11B:
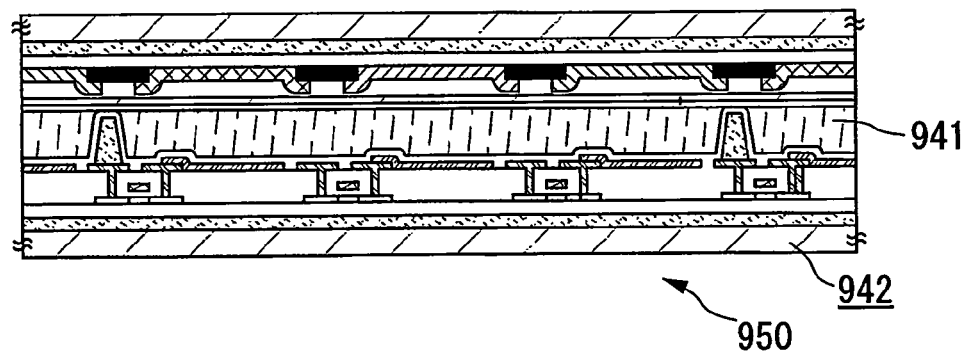

As shown in FIG. 11B, a liquid crystal material 941 is filled between the two pieces of substrates, i.e., between the first and second alignment films 938, 940. By using a second sealing material (not shown), the two pieces of substrates are sealed completely.

According to the above steps, a liquid crystal display device 950 using the plastic substrate and the color filter formed on the plastic substrate as shown in FIG. 11B can be manufactured.

Although the present embodiment only shows a transmissive liquid crystal display device, a reflective liquid crystal display device or a semiconductor transmissive liquid crystal display device can also be used.

The present embodiment is applicable to any one of Embodiment 1 and Embodiment Modes 3 to 6, instead of Embodiment Mode 2.

According to the present invention, the color filter can be formed on the plastic substrate. When an optical film such as a polarizing plate, a retardation plate, and a light diffusing film is formed using the color filter, an optical film integrated with plural properties can be achieved.

The liquid crystal display device manufactured according to the embodiment has a structure as follows: the layer including the liquid crystal element or the semiconductor element and the substrate having the color filter can be manufactured separately through the different steps, and they are attached to each other after completion. By utilizing the structure, the yield of the liquid crystal element or the semiconductor element and the yield of the optical film can be controlled individually, thereby suppressing reduction in the yield of the entire liquid crystal display device.

Further, the steps for manufacturing an active matrix substrate and the steps for manufacturing the substrate having the color filter can be run simultaneously, thereby reducing the manufacturing lead time of the liquid crystal display device.

Embodiment 3

In the present embodiment, an exterior appearance of a light emitting display device panel corresponding to one embodiment of a display device according to the invention will be explained with reference to FIGS. 12A and 12B. FIG. 12A shows a tow view of a panel in which a first substrate with a semiconductor element formed thereon and a second substrate having a color filter are sealed with a first sealing material 1205 and a second sealing material 1206, while FIG. 12B shows a cross sectional view taken along a line A-A' of FIG. 12A.

In FIG. 12A, reference numeral 1201 denoted by a doted line represents a signal line driver circuit; 1202, a pixel portion; and 1203, a scanning line driver circuit. In the embodiment, the signal line driver circuit 1201, the pixel portion 1202, and the scanning line driver circuit 1203 are positioned within a region sealed with the first and second sealing materials. As the first sealing material, an epoxy resin containing filler with high viscosity is preferably used. As the second sealing material, an epoxy resin having low viscosity is preferably used. Further, it is desirable that the first and second sealing materials 1205, 1206 be materials that do not transmit moisture and oxygen as much as possible.

Reference numeral 1240 denotes a connection wiring for transmitting signals inputted in the signal line driver circuit 1201 and the scanning line driver circuit 1203, and receives video signals and clock signals via a connection wiring 1208 from an FPC (flexible printed circuit) 1209, which becomes an external input terminal.

Next, a cross sectional structure will be described referring to FIG. 12B. The first substrate 1200 is provided with a driver circuit and a pixel portion along with plural semiconductor elements typified by a TFT. A color filter 1223 is provided on a surface of a second substrate 1204. The substrate 614 having the color filter (i.e., the second substrate 1204 and the color filter 1223 provided thereon) that is formed according to Embodiment 1 can be used here. As for the driver circuit, the signal line driver circuit 1201 and the pixel portion 1202 are illustrated. A CMOS circuit formed in combination with an n-channel TFT 1221 and a p-channel TFT 1222 is provided as the signal line driver circuit 1201.

Since the TFTs of the signal line driver circuit, the scanning line driver circuit, and the pixel portion respectively are formed over the same substrate in the present embodiment, the volume of the light emitting display device can be reduced.

The pixel portion 1202 includes a plurality of pixels having a switching TFT 1211, a driver TFT 1212, and a first electrode (anode) 1213 made from a conductive film with a light-shielding property, which is electrically connected to a drain of the driver TFT 1212.

An interlayer insulating film 1220 of these TFTs 1211, 1212, 1221, and 1222 may be formed of a material containing an inorganic material (such as silicon oxide, silicon nitride, and silicon oxynitride) or an organic material (such as polyimide, polyamide, polyimide amide, benzocyclobutene, and siloxane polymer) as its principal constituent. When the interlayer insulating film is formed of siloxane polymer, it becomes to have a skeleton formed by the bond of silicon and oxygen and include hydrogen or/and alkyl group in a side chain.

An insulator (also referred to as a bank, a partition wall, a barrier, an embankment, etc.) 1214 is formed on each end of the first electrode (anode) 1213. To improve coverage of a film formed on the insulator 1214, an upper edge portion or a lower edge portion of the insulator 1214 is formed so as to have a curved surface having a radius of curvature. The insulator 1214 may be formed of a material containing an inorganic material (such as silicon oxide, silicon nitride, and silicon oxynitride) or an organic material (such as polyimide, polyamide, polyimide amide, benzocyclobutene, and siloxane polymer) as its principal constituent. When the insulator is made from siloxane polymer, it becomes to have a skeleton formed by the bond of silicon and oxygen and include hydrogen or/and alkyl group in a side chain. Further, the insulator 1214 may be covered with a protective film (a planarizing layer) made from an aluminum nitride film, an aluminum nitride oxide film, a thin film containing carbon as its principal constituent, or a silicon nitride film.

An organic compound material is vapor deposited on the first electrode (anode) 1213 to form a layer 1215 containing a luminescent substance, selectively.

To remove gases contained in the substrate prior to performing the vapor deposition of the material for the layer containing the luminescent substance, a heat treatment at a temperature of 200 to 300° C. is desirably carried out under a reduced pressure atmosphere or an inert atmosphere.

In order to make the layer 1215 containing the luminescent substance emit white light, for example, white light emission can be achieved by sequentially laminating $Alq_3$, $Alq_3$ partially doped with Nile red, which is a red light emitting pigment, $Alq_3$, p-EtTAZ, and TPD (aromatic diamine) by using vapor deposition.

The layer 1215 containing the luminescent substance may be formed to have a single layer. In this case, 1,3,4-oxadiazole derivative (PBD), which has electron transporting properties, may be dispersed in polyvinyl carbazole (PVK), which has hole transporting properties. In addition, white light emission can also be obtained by dispersing 30 wt % of PBD as an electron transporting agent and dispersing a suitable amount of four kinds of pigments (TPB, coumarin 6, DCM1, and Nile red). In addition to the above-mentioned light emitting element that emits white light, a light emitting element that emits red light, green light, or blue light can be manufactured by properly selecting the materials of the layer 1215 containing the luminescent substance.

Note that triplet excited luminescent materials including metal complexes and the like may be used for the layer 1215 containing the luminescent substance, instead of the above-mentioned singlet excited luminescent materials.

As a material for the second electrode (cathode) 1216, a transparent conductive film may be used.

Thus, a light emitting element 1217 including the first electrode (anode) 1213, the layer 1215 containing the luminescent substance, and the second electrode (cathode) 1216 can be formed. The light emitting element 1217 emits light toward the second substrate 1204. The light emitting element 1217 is one example of light emitting elements that emit white light. A full color display can be performed by transmitting light emitted from the light emitting element 1217 through the color filter.

Alternatively, in the case where the light emitting element 1217 is one of light emitting elements that emit monochromatic light of R, G, and B respectively, a full color display can be performed by selectively using three light emitting elements with layers containing organic compounds, which emit respective colors of R, Q and B. In this case, a light emitting display device with high color purity can be obtained by aligning respective colored layers of red, green, and blue for the color filters to the light emitting elements that emit respective colors.

A protective lamination layer 1218 is formed to encapsulate the light emitting element 1217. The protective lamination layer is formed by laminating a first inorganic insulating film, a stress relaxation film, and a second inorganic insulating film. The protective lamination layer 1218 and the substrate 614 having the color filter (i.e., the second substrate 1204 and the color filter 1223) are attached to each other with the first sealing material 1205 and the second sealing material 1206. The surface of the second substrate 1204 is fixed with a polarizing plate 1225 using an adhesive material 1224. A surface of the polarizing plate 1225 is provided with a retardation plate 1229 having ½λ or ¼λ and an antireflection film 1226.

The connection wiring 1208 and the FPC 1209 are electrically connected to one another with an anisotropic conductive film or an anisotropic conductive resin 1227.

As set forth above, one feature of the light emitting display device according to the present embodiment is that the layer having the elements and the color filter are formed separately through the different steps, and they are attached to each other after completion. According to the structure, the yield of the layer having the elements, i.e., the TFTs and the liquid crystal element and the yield of the color filter can be controlled individually, thereby suppressing reduction in the yield of the entire light emitting display device.

Further, the steps of manufacturing an active matrix substrate and the steps of manufacturing the color filter can run simultaneously, reducing the manufacturing lead time for the light emitting display device.

Further, since the plastic substrate is used, a lightweight light emitting display device having an improved impact resistance property can be manufactured.

Embodiment 4

Figure 13A:
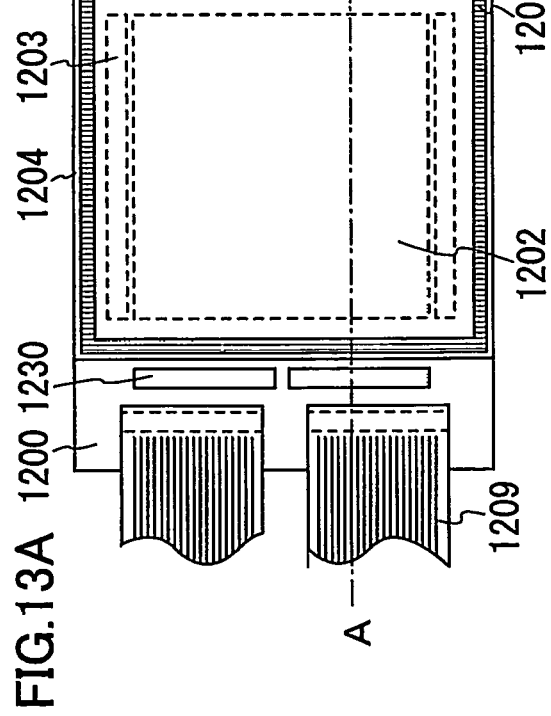
FIG. 13A is a top view and FIG. 13B is a cross sectional view showing a display panel manufactured according to the invention.
Figure 13B:
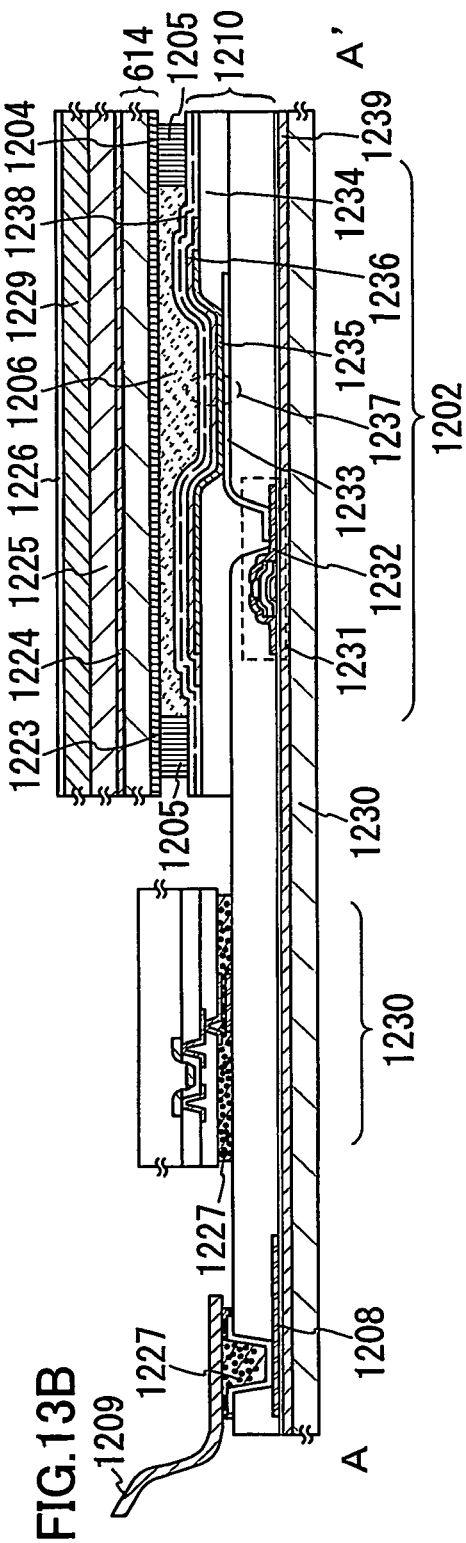

In the present embodiment, an exterior appearance of a light emitting display device panel corresponding to one embodiment of a display device according to the invention will be explained with reference to FIGS. 13A and 13B. FIG. 13A shows a tow view of a panel in which a first substrate with a semiconductor element formed thereon and a second substrate having a color filter are attached to each other by using a first sealing material 1205 and a second sealing material 1206. FIG. 13B corresponds to a cross sectional view taken along a line A-A' of FIG. 13A. In the embodiment, an example in which a signal line driver circuit using an IC chip is mounted on the light emitting display device is shown.

In FIG. 13A, reference numeral 1230 represents a signal line driver circuit; 1202, a pixel portion; and 1203, a scanning line driver circuit. Further, reference numeral 1200 denotes the first substrate; reference numeral 1204 denotes the second substrate; and reference numerals 1205, 1206 denote the first and second sealing materials that contain gap materials for maintaining a gap of an enclosed space, respectively.

The pixel portion 1202 and the scanning line driver circuit 1203 are positioned inside a region sealed with the first and second sealing materials, while the signal line driver circuit 1230 is positioned outside of the region sealed with the first and second sealing materials.

Next, a cross sectional structure will be described referring to FIG. 13B. A driver circuit and a pixel portion are formed over the first substrate 1200, which includes a plurality of semiconductor elements represented by the TFTs. The signal line driver circuit 1230 that is one of driver circuits is connected to a terminal on a layer 1210 with a semiconductor element formed therein. The pixel portion 1202 is provided on the first substrate. The signal line driver circuit 1230 is made from an IC chip using a single crystal silicon substrate. As substitute for the IC chip using the single crystal silicon substrate, an integrated circuit chip formed by a TFT can be used. The pixel portion 1202 and the scanning line driver circuit (not shown in FIG. 13B) are formed of TFTs. The pixel driving TFT and the scanning line driver circuit are formed of inverted-stagger type TFTs, in the embodiment. A part or an entire of respective components for the inverted-stagger type TFTs can be formed by an ink-jet method, a droplet discharging method, the CVD method, the PVD method, and the like. A channel formation region of the TFT 1231 is formed of an amorphous semiconductor film, a microcrystalline semiconductor film, or an organic semiconductor film.

The microcrystalline semiconductor film is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$, and the like can be used. The silicide gas may also be diluted with $H_2$ or a mixture of $H_2$ and one or more rare gas elements selected from the group consisting of He, Ar, Kr, and Ne. It is preferable that the dilution ratio be in the range of from 1:2 to 1:1,000. The pressure may approximately be in the range of from 0.1 Pa to 133 Pa The power supply frequency is in the range of from 1 MHz to 120 MHz, preferably, from 13 MHz to 60 MHz. The substrate heating temperature may be set to 300° C. or less, preferably from 100° C. to 250° C. As for impurity elements contained in the film, each concentration of impurities for atmospheric constituents such as oxygen, nitrogen, and carbon is preferably set to $1 \times 10^{20}/cm^3$ or less. In particular, the oxygen concentration is preferably set to $5 \times 10^{19}/cm^3$ or less; more preferably, $1 \times 10^{19}/cm^3$ or less. The fluctuation in the electric characteristics of the TFTs can be reduced by using the microcrystalline semiconductor film.

A light emitting element 1237 includes a first electrode 1233, a layer 1235 containing a luminescent substance, and a second electrode 1236. The electrodes and layer are formed using the same materials and manufacturing methods of Embodiment 3. The light emitting element is electrically connected to a TFT 1231 via a wiring 1232. Various kinds of signals and potential applied to the scanning line driver circuit 1203 and the pixel portion 1202 are supplied from an FPC 1209 via a connection wiring 1208. The connection wiring 1208 and the FPC 1209 are electrically connected to one another with an anisotropic conductive film or anisotropic conductive resin 1227.

A polarizing plate 1225 is provided on a surface of the second substrate 1204 as well as Embodiment 3. A retardation plate 1229 of ½λ or ¼λ and an antireflection film 1226 are provided on the surface of the polarizing plate 1225.

As set forth above, one feature of the light emitting display device according to the present embodiment is that the layer having the elements and the color filter are formed separately through the different steps, and they are attached to each other after completion. According to the structure, the yield of the layer having the elements, i.e., the TFTs and the liquid crystal element and the yield of the color filter can be controlled individually, thereby suppressing reduction in the yield of the entire light emitting display device.

Further, the steps of manufacturing an active matrix substrate and the steps of manufacturing the color filter can run simultaneously, reducing the manufacturing lead time for the light emitting display device.

In addition, since the plastic substrate is used, a lightweight light emitting display device having an excellent impact resistance property can be manufactured.

Embodiment 5

Figure 15A:
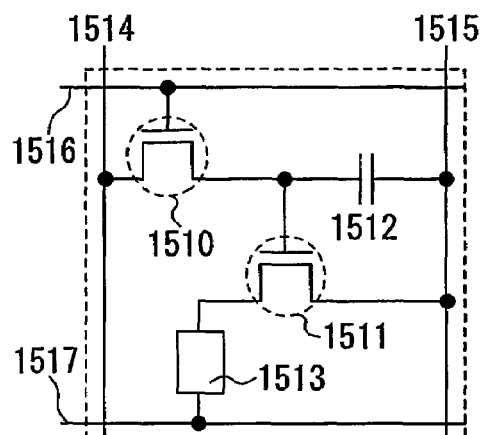
FIGS. 15A to 15C are circuit diagrams of pixels for light emitting elements.

Circuit diagrams of pixels for a light emitting display device corresponding to one embodiment of the invention will be described with reference to FIGS. 15A to 15C. FIG. 15A shows an equivalent circuit diagram of a pixel, including a signal line 1514, a power supply lines 1515, 1517, a scanning line 1516, a light emitting element 1513, a TFT 1510 for controlling input of video signals to the pixel, a TFT 1511 for controlling an amount of current that flows between electrodes, and a capacitor element 1512 for holding a gate-source voltage. Although the capacitor element 1512 is shown in FIG. 15A, it may not be provided in the case where a gate capacitance or the other parasitic capacitance can serve as a capacitor for holding the gate-source voltage.

Figure 15B:
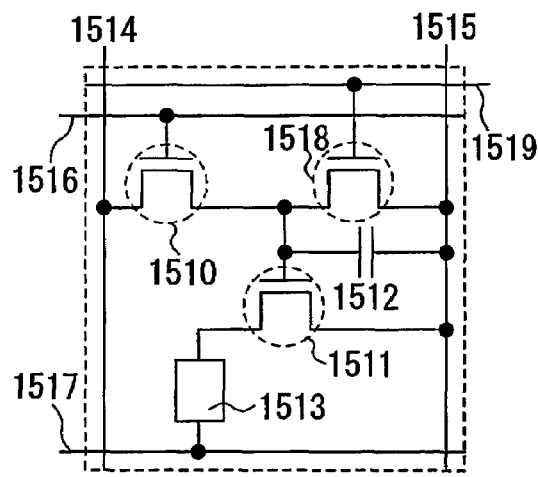

FIG. 15B shows a pixel circuit having a structure in which a TFT 1518 and a scanning line 1519 are additionally provided to the pixel shown in FIG. 15A. Supply of the current can be forcibly stopped due to the arrangement of the TFT 1518, thereby starting a lighting period simultaneously with or immediately after a writing period starts before signals are written in all of the pixels. Therefore, duty ratio is increased, and in particular, moving image can be displayed preferably.

Figure 15C:
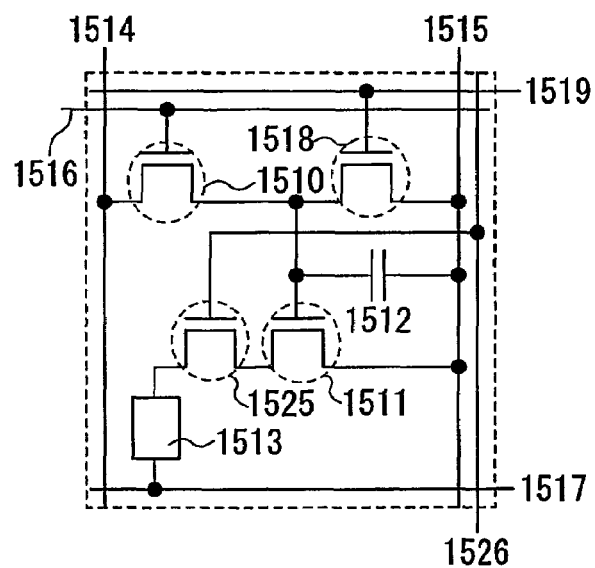

FIG. 15C shows a pixel circuit in which a TFT 1525 and a wiring 1526 are additionally provided to the pixel shown in FIG. 15B. In this structure, a gate electrode of a TFT 1525 is connected to a wiring 1526 maintaining a constant potential so that the potential for the gate electrode is fixed. Further, the TFT 1525 is operated in a saturation region. The TFT 1511 is connected to the TFT 1525 in series and operated in a linear region. A gate electrode of the TFT 1511 is input with video signals for transmitting information about lighting or non-lighting of the pixel via the TFT 1510. Since the source-drain voltage for the TFT 1511 that is operated in the linear region is low, slight variation in the gate-source voltage of the TFT 1511 does not adversely affect the amount of current flowing through the light emitting element 1513. Therefore, the amount of current flowing through the light emitting element 1513 is determined by the TFT 1525, which is operated in the saturation region. According to the invention having the above-mentioned structure, luminance fluctuation of the light emitting element 1513, which is caused due to fluctuation in the characteristics of the TFT 1525, can be improved, thereby improving the image quality. It is preferable that the channel length $L_1$ and the channel width $W_1$ for the TFT 1525, and the channel length $L_2$ and the channel width $W_2$ for the TFT 1511 be set so as to satisfy the relation of $L_1/W_1:L_2/W_2=5$ to 6,000:1. It is also preferable that the TFTs 1525 and 1511 comprise a same conductivity type from the viewpoint of the manufacturing steps. The TFT 1525 may be either an enhancement TFT or a depletion TFT.

In the light emitting display device of the invention, the method of driving screen display is not particularly limited. For example, a dot sequential driving method, a line sequential driving method, a surface sequential driving method, and the like may be used. The line sequential driving method is typically used, and a time division gray scale driving method or a surface area gray scale driving method may also be employed appropriately. Further, a source line of the light emitting display device may be input with either analog signals or digital signals. A driver circuit and the like may be designed properly according to the image signals.

Light emitting display devices using digital video signals are classified into one in which video signals are input to a pixel at a constant voltage (CV), and another one in which video signals are input to a pixel at a constant current (CC). The light emitting devices in which video signals are input to a pixel at a constant voltage (CV) are further classified into one in which a constant voltage is applied to a light emitting element (CVCV), and another one in which a constant current is supplied to a light emitting element (CVCC). The light emitting devices in which video signals are input to a pixel at a constant current (CC) is still classified into one in which a constant voltage is applied to a light emitting element (CCCV), and another one in which a constant current is supplied to a light emitting element (CCCC).

In the light emitting display device according to the invention, a protection circuit (e.g., a protection diode and the like) may be provided to the driver circuits or the pixel portion for the purpose of inhibiting electrostatic discharge damage.

Embodiment 6

In the present embodiment, an exterior appearance of a liquid crystal display device panel corresponding to one embodiment of a display device according to the invention will be explained with reference to FIGS. 16A and 16B. FIG. 16A shows a tow view of a panel in which a first substrate with a semiconductor element formed thereon and a second substrate having a color filter are attached to each other by using a first sealing material 1605 and a second sealing material 1606. FIG. 16B corresponds to a cross sectional view taken along a line A-A' of FIG. 16A.

In FIG. 16A, reference numeral 1601 denoted by a dotted line represents a signal line driver circuit; 1602, a pixel portion; and 1603, a scanning line driver circuit. In the present embodiment, the signal line driver circuit 1601, the pixel-portion 1602, and the scanning line driver circuit 1603 are provided inside a region sealed with the first and second sealing materials.

Further, reference numeral 1600 denotes the first substrate; and 1604, the second substrate. Reference numerals 1605 and 1606 represent the first and second sealing materials, respectively, that contain a gap material for maintaining a gap of an enclosed space. The first substrate 1600 and the second substrate 1604 are attached to each other with the first and second sealing materials 1605, 1606, and a liquid crystal material is filled therebetween.

A cross sectional structure will be described referring to FIG. 16B. Driver circuits and a pixel portion are formed on the first substrate 1600 along with plural semiconductor elements typified by a TFT. A color filter 1621 is provided on a surface of the second substrate 1604. A substrate 914 having the color filter, which is formed according to Embodiment 2 (i.e., the second substrate 1604 and the color filter 1621 provided thereon), can be used. The signal line driver circuit 1601 and the pixel portion 1602 are illustrated as the driver circuits. The signal line driver circuit 1601 is formed of a CMOS circuit in combination of an n-channel TFT 1612 and a p-channel TFT 1613.

The TFTs of the signal line driver circuit, the scanning line driver circuit, and the pixel portion are formed on the same substrate in the present embodiment so that volume of the panel can be reduced.

A plurality of pixels is formed in the pixel portion 1602, and a liquid crystal element 1615 is formed in each pixel. The liquid crystal element 1615 indicates a region overlapping a first electrode 1616, a second electrode 1618, and a liquid crystal material 1619, which is filled between the first and second electrodes, with one another. The first electrode 1616 of the liquid crystal element 1615 is electrically connected to the TFT 1611 via the wiring 1617. The second electrode 1618 of the liquid crystal element 1615 is formed on a side of the second substrate 1604, that is, on the color filter 1621. Note that alignment films are formed on each surface of respective pixel electrodes, though not shown in the drawing.

Reference numeral 1622 represents a columnar spacer that is provided to maintain a distance (cell gap) between the first electrode 1616 and the second electrode 1618. The spacer is formed by etching an insulating film into a predetermined shape. Alternatively, a spherical spacer may be employed. Various kinds of signals and potential are applied to the signal line driver circuit 1601 and the pixel portion 1602 from an FPC 1609 via a connection wiring 1623. The connection wiring 1623 and the FPC are electrically connected to one another with an anisotropic conductive film or anisotropic conductive resin 1627. Note that a conductive paste such as solder may be used in place of the anisotropic conductive film or anisotropic conductive resin.

A polarizing plate 1625 is fixed to the surface of the second substrate 1604 with an adhesive material 1624. A circular polarizing plate or an elliptical polarizing plate provided with a retardation plate may be used as the polarizing plate 1625. A retardation plate of $\frac{1}{2}\lambda$ or $\frac{1}{4}\lambda$ and an antireflection film 1626 are provided on the surface of the polarizing plate 1625. Similarly, the surface of the first substrate 1600 is provided with a polarizing plate (now shown) with an adhesive material.

According to the embodiment, a liquid crystal display device having an optical film with a plastic substrate can be fabricated. As a consequence, a lightweight, thin liquid crystal display device having an excellent impact resistance property can be manufactured. In addition, a display device having a curved surface and a liquid crystal display device that can be varied in shape can be manufactured.

Embodiment 7

In the present embodiment, an exterior appearance of a panel corresponding to one embodiment of a display device according to the invention will be explained with reference to FIGS. 17A and 17B. FIG. 17A shows a tow view of a panel in which a first substrate with a semiconductor element formed thereon and a second substrate having a color filter are attached to each other by using a first sealing material 1605 and a second sealing material 1606. FIG. 17B corresponds to a cross sectional view taken along a line A-A' of FIG. 17A. An example in which a signal line driver circuit using an IC chip is mounted on the panel is shown here.

In FIG. 17A, reference numeral 1630 represents a signal line driver circuit; 1602, a pixel portion; and 1603, a scanning line driver circuit. Further, reference numeral 1600 denotes the first substrate; and 1604, the second substrate. Reference numerals 1605 and 1606 represent the first and second sealing materials, respectively, that contain a gap material for maintaining a cell gap of an enclosed space.

The pixel portion 1602 and the scanning line driver circuit 1603 are provided inside a region sealed with the first and second sealing materials, while the signal line driver circuit 1630 is provided outside of the region sealed with the first and second sealing materials. The first and second substrates 1600, 1604 are attached to each other with the first and second sealing materials 1605, 1606, and a liquid crystal material is filled therebetween.

Next, a cross sectional structure will be described referring to FIG. 17B. A driver circuit and a pixel portion are formed over the first substrate 1600, which includes a plurality of semiconductor elements represented by a TFT. The signal line driver circuit 1630 that is one of the driver circuits is connected to a terminal on the layer 1610 with the semiconductor element formed therein. The pixel portion 1602 is provided over the first substrate. The signal line driver circuit 1630 is made from an IC chip suing a single crystal silicon substrate. As substitute for the IC chip using the single crystal silicon substrate, an integrated circuit chip formed of a TFT can be used. The pixel portion 1602 and the scanning line driver circuit (not shown in FIG. 17B) are formed of the TFTs. In the present embodiment, a pixel driving TFT and a scanning line driver circuit are formed of inverted-stagger type TFTs, which are made from amorphous semiconductor films or microcrystalline semiconductor films.

A first electrode 1616 of the liquid crystal element 1615 is electrically connected to a TFT 1631 via a wiring 1632 in the same manner as Embodiment 6. A second electrode 1618 of the liquid crystal element 1615 is formed on the second substrate 1604, i.e., on the color filter 1621. Reference numeral 1622 represents a columnar spacer, and is provided for maintaining the distance (cell gap) between the first electrode 1616 and the second electrode 1618. Various kinds of signals and potential are applied to the scanning line driver circuit 1603 and the pixel portion 1602 from an FPC 1609 via a connection wiring 1623. The connection wiring 1623 and the FPC are electrically connected to one another with an anisotropic conductive film or anisotropic conductive resin 1627.

A polarizing plate 1625 is fixed on the surface of the second substrate 1604 with an adhesive material 1624 in the same manner as Embodiment 6. A retardation plate 1629 of $\frac{1}{2}\lambda$ or $\frac{1}{4}\lambda$ and an antireflection film 1626 are provided on the surface of the polarizing plate 1625.

According to the embodiment, a liquid crystal display device having an optical film with a plastic substrate can be fabricated. As a consequence, a lightweight, thin liquid crystal display device having an excellent impact resistance property can be manufactured. Additionally, a display device having a curved surface and a display device that can be varied in shape can be manufactured.

Also, since a plastic substrate is used, a lightweight liquid crystal display device having an improved impact resistance property can be fabricated.

Embodiment 8

Figure 19:
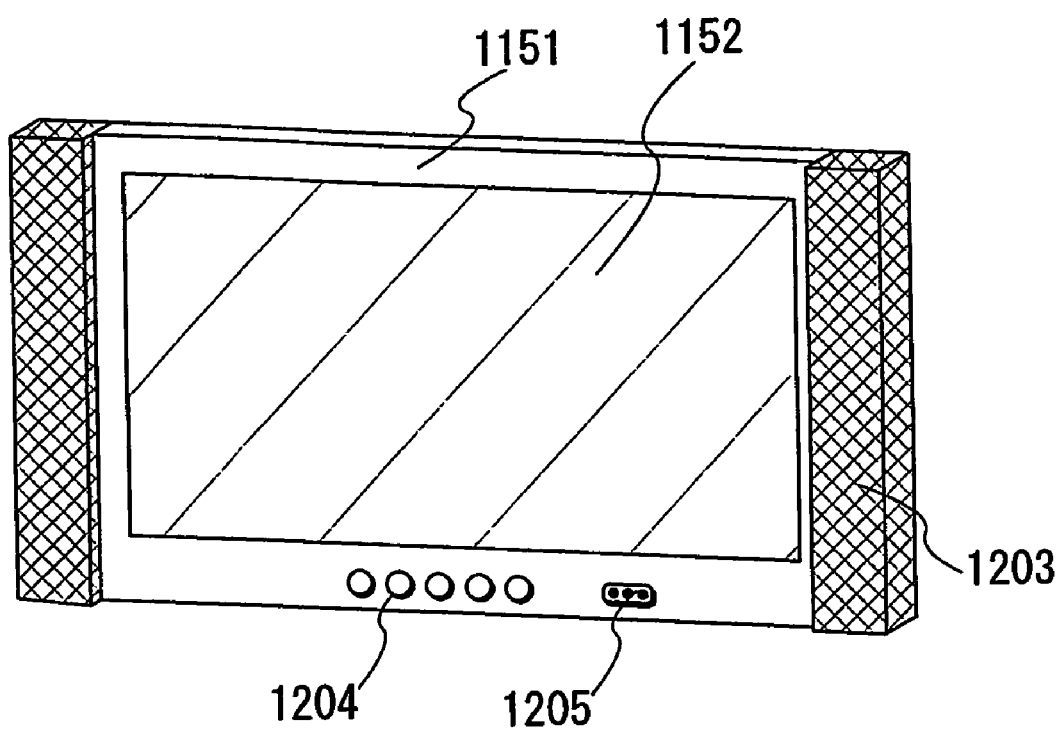
FIG. 19 is a diagram explaining an example of an electronic appliance.
Figure 20A:
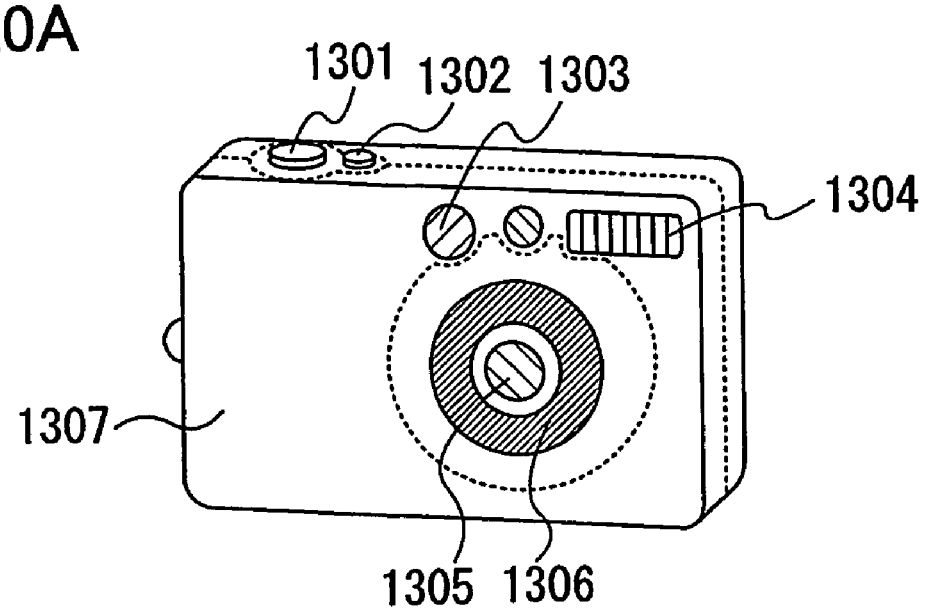
FIGS. 20A and 20B are diagrams explaining an example of an electronic appliance.
Figure 20B:
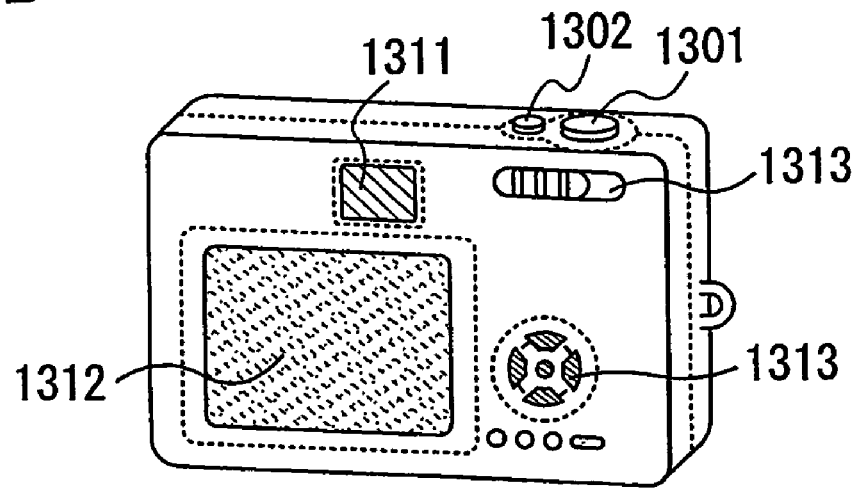

Various kinds of electronic appliances can be manufactured by being incorporated with a display device formed according to the present invention. Examples of the electronic appliances include: a TV set; a video camera; a digital camera; a goggle type display (a head-mounted display); a navigation system; an audio reproduction device (such as a car audio and an audio component system); a personal laptop computer; a game machine; a portable information terminal (such as a mobile computer, a cellular telephone, a portable game machine, and an electronic book); an image reproduction device provided with a recording medium (typically, a device which can reproduce the recording medium such as a digital versatile disc (DVD) and display images thereof); and the like. As representative examples of these electronic appliances, a block diagram and a perspective view of a television are shown in FIG. 18 and FIG. 19, respectively, while perspective views of a digital camera are shown in FIGS. 20A and 20B.

Figure 18:
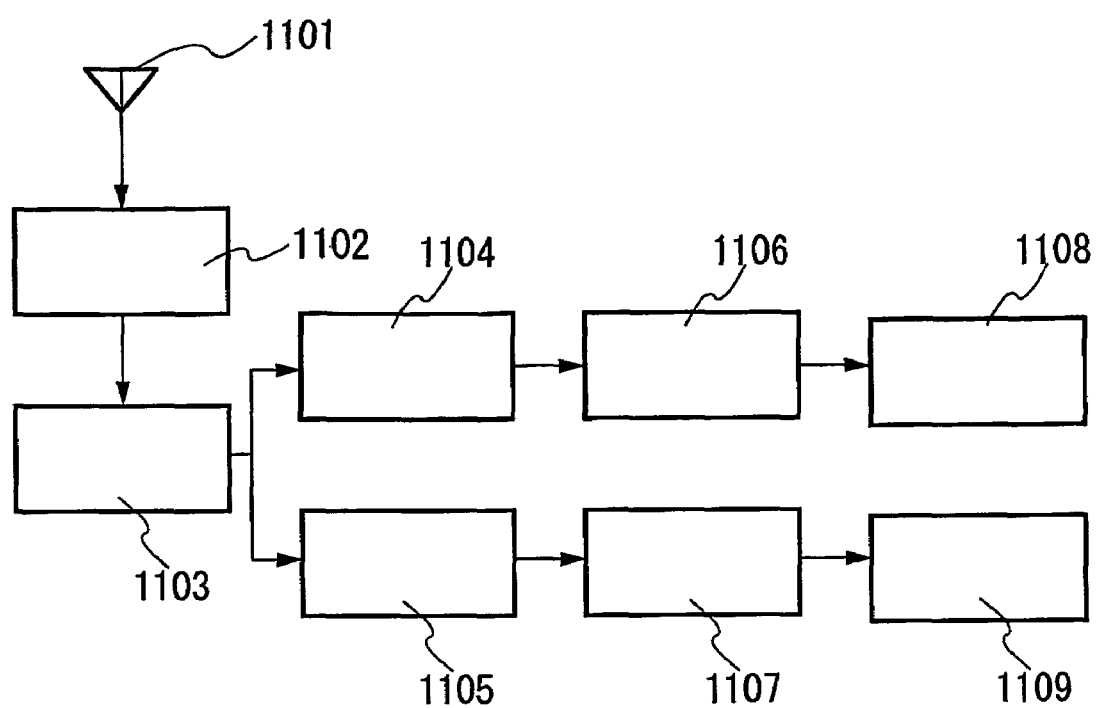
FIG. 18 is a diagram explaining a structure of an electronic appliance.

FIG. 18 shows a general structure of a television receiving analog television broadcasting. In FIG. 18, the airwaves for television broadcasting received by an antenna 1101 are input in a tuner 1102. The tuner 1102 generates and outputs intermediate frequency (IF) signals by mixing the high frequency television signals input by the antenna 1101 and locally-oscillating frequency signals that are controlled in accordance with the predetermined reception frequency.

The IF signals output from the tuner 1102 are amplified up to the required amount of voltage by an intermediate frequency amplifier (IF amplifier) 1103. Thereafter, the amplified IF signals are detected by an image detection circuit 1104 and an audio detection circuit 1105. The signals output from the image detection circuit 1104 are divided into luminance signals and color signals by an image processing circuit 1106. Further, the luminance signals and the color signals are subjected to the predetermined image signal processing to become image signals so that the image signals are output to an image output unit 1108 such as a CRT, a LCD, and an EL display.

The signals output from the audio detection circuit 1105 are subjected to processing such as FM demodulation in an audio processing circuit 1107 to become audio signals. The audio signals are then amplified arbitrarily so as to be output to an audio output unit 1109 such as a speaker.

The television according to the present invention may be applicable to digital broadcastings such as digital terrestrial broadcasting, cable digital broadcasting, and BS digital broadcasting, besides analog broadcastings such as regular broadcasting in VHF band, in UHF band, etc., cable broadcasting, and BS broadcasting.

FIG. 19 shows a perspective view seen from the front of the television, including a housing 1151; a display portion 1152; speaker units 1153; an operational portion 1154; a video input terminal 1155; and the like. The television shown in FIG. 19 includes the structure as shown in FIG. 18.

The display portion 1152 is an example of the image output unit 1158 in FIG. 18, and displays images.

The speaker units 1153 are examples of the audio output unit in FIG. 18, and output sounds therefrom.

The operational portion 1154 is provided with a power source switch, a volume switch, a channel select switch, s tuning switch, a selection switch, and the like, so as to turn on and off the television, select images, control sounds, select tuner, and the like, respectively. Note that above-mentioned selections can be carried out by using an operation unit of a remote controller, though not illustrated in the drawing.

The video input terminal 1155 inputs image signals into the television from an external portion such as a VTR, a DVD, and a game machine.

In the case of a wall-hanging television, a wall-hanging portion is provided on the rear of the body thereof.

By utilizing the display device of the invention to the display portion of the television; a thin, lightweight television having an excellent impact resistance property can be manufactured. Therefore, such television is widely applicable to a wall-hanging television, in particular, to large-size display mediums such as information display boards used in railway stations, airports, etc., and advertisement display boards on the streets.

Next, an example in which the display device manufactured according to the invention is applied to a digital camera will be described with reference to FIGS. 20A and 20B.

FIGS. 20A and 20B are diagrams showing an example of the digital camera FIG. 20A shows a perspective view seen from the front of the digital camera, while FIG. 20B shows a perspective view seen from the rear thereof. In FIG. 20A, reference numeral 1301 represents a release button; 1302, a main switch; 1303, a viewfinder window; 1304, flash; 1305, a lens; 1306, a lens barrel; and 1307, a housing.

In FIG. 20B, reference numeral 1311 represents a viewfinder eyepiece; 1312, a monitor; and 1313, an operational button.

Upon depressing the release button 1301 halfway, a focus adjustment mechanism and an exposure adjustment mechanism are operated. Subsequently, depressing the release button all the way releases a shutter.

The digital camera is turned on and off by pressing or rotating the main switch 1302.

The viewfinder window 1303 is disposed above the lens 1305 in the front face of the digital camera, and a shooting range and a focusing point are checked through the viewfinder eyepiece 1311 as shown in FIG. 20B and the viewfinder window.

The flash 1304 is disposed at the top of the front face of the digital camera body. In the case of photographing a subject of the low luminance level, after depressing the release button, the shutter is released to take the picture simultaneously with flushing a light.

The lens 1305 is attached to the front of the digital camera. The lens is made of a focusing lens, a zoom lens, and the like. An optical shooting system includes the lens along with a shutter and an aperture, which are not illustrated in the drawing.

The lens barrel 1306 is used for shifting the lens position so as to focus the focusing lens, the zoom lens, and the like on a subject. To take the picture, the lens barrel protrudes from the body so that the lens 1305 is shifted toward a subject. When carrying the digital camera, the lens 1305 is stored inside the main body to be reduced in size. Although the lens can be zoomed in to enlarge a subject by shifting the lens barrel in the present embodiment, the present invention is not limited to the structure. The invention can be applicable to a digital camera that can take close-up pictures without zooming a lens due to a structure of an optical shooting system inside the housing 1307.

The viewfinder eyepiece 1311 is provided at the top portion of the rear of the digital camera, through which the shooting range and the focusing point are checked by sight.

The operational button 1313 represents a button with various kinds of functions and is provided on the rear of the digital camera The operational button include a setup button, a menu button, a display button, a functional button, a selection button, and the like.

By utilizing the display device of the invention to a monitor of the digital camera, a thinner, portable digital camera can be manufactured.

The present invention has been fully described by way of embodiment modes and embodiments with reference to the accompanying drawings. Note that it should be understood to those skilled in the art that the present invention can be embodied in several forms, and the modes and its details can be changed and modified without departing from the purpose and scope of the present invention. Accordingly, interpretation of the present invention should not be limited to descriptions mentioned in the foregoing embodiment modes and embodiments. Note that portions identical to each other are denoted by same reference numerals in the accompanying drawings for the sake of convenience.

The invention claimed is:

1. A method of manufacturing a display device, comprising:
   a first step of sequentially laminating a first metal film, a first oxide film, and an optical filter on a first substrate, attaching a first support medium to a surface of the optical filter by using a first adhesive agent such that the first support medium faces the first substrate through the optical filter, and separating the first metal film from the first oxide film;

a second step of forming a layer including a pixel on a second substrate; and a third step of attaching the first oxide film to a surface of the layer including the pixel of the second substrate by using a first adhesive material after the first and second steps, and removing the first adhesive agent and the first support medium.

2. The method of manufacturing the display device according to claim 1, further comprising a fourth step of attaching a third substrate to a surface of the optical filter by using a second adhesive material after the third step.

3. The method of manufacturing the display device according to claim 1, wherein the first substrate and the second substrate are any of a quartz substrate, a ceramic substrate, a silicon substrate, a metal substrate, and a stainless substrate, while the third substrate is plastic, a polarizing plate, or a polarizing plate having a retardation plate.

4. The method of manufacturing the display device according to claim 1, wherein the surface of the second substrate is attached with a plastic, a polarizing plate, or a polarizing plate having a retardation plate after the second or the third step.

5. A method of manufacturing a display device, comprising:

a first step of sequentially laminating a first metal film, a first oxide film, and an optical filter on a first substrate, attaching a second substrate to a surface of the optical filter by using a first adhesive material such that the second substrate faces the first substrate through the optical filter, attaching a first support medium to a surface of the second substrate by using a first adhesive agent, and separating the first metal film from the first oxide film so as to form an optical filter;

a second step of forming a layer including a pixel on a third substrate; and a third step of attaching the first oxide film to a surface of the layer including the pixel of the third substrate by using a second adhesive material after the first and second steps, and removing the first adhesive agent and the first support medium.

6. A method of manufacturing a display device, comprising:

a first step of sequentially laminating a first metal film, a first oxide film, and an optical filter on a first substrate, attaching a first support medium to a surface of the optical filter by using a first adhesive agent such that the first support medium faces the first substrate through the optical filter, separating the first metal film from the first oxide film, attaching a second substrate to a surface of the first oxide film by using a first adhesive material, and removing the first support medium and the first adhesive agent so as to form an optical film;

a second step of forming a layer including a pixel on a third substrate; and a third step of attaching the optical filter to a surface of the layer including the pixel of the third substrate by using a second adhesive material after the first and second steps.

7. The method of manufacturing the display device according to claim 5 or claim 6, wherein the first substrate and the third substrate are any of a quartz substrate, a ceramic substrate, a silicon substrate, a metal substrate, and a stainless substrate, while the second substrate is plastic, a polarizing plate, or a polarizing plate having a retardation plate.

8. The method of manufacturing the display device according to claim 5 or claim 6, wherein in the second step or the third step, a surface of the third substrate is attached with plastic, a polarizing plate, or a polarizing plate having a retardation plate.

9. A method of manufacturing a display device, comprising:

a first step of sequentially laminating a first metal film, a first oxide film, and an optical filter on a first substrate, attaching a first support medium to a surface of the optical filter by using a first adhesive agent such that the first support medium faces the first substrate through the optical filter, and separating the first metal film from the first oxide film;

a second step of sequentially laminating a second metal film, and a second oxide film on a second substrate, and forming a layer including a pixel on the second oxide film; and a third step of attaching the first oxide film to a surface of the layer including the pixel of the second substrate by using a first adhesive material after the first and second steps, separating the second metal film from the second oxide film, attaching a third substrate to a surface of the second oxide film by using a second adhesive material, and removing the first adhesive agent and the first support medium.

10. The method of manufacturing the display device according to claim 9, further comprising a fourth step of attaching the third substrate to a surface of the optical filter by using the second adhesive material after the third step.

11. The method of manufacturing the display device according to claim 9, wherein the first substrate and the second substrate are any of a quartz substrate, a ceramic substrate, a silicon substrate, a metal substrate, and a stainless substrate, while the third substrate and fourth substrate are any of plastic, a polarizing plate, and a polarizing plate having a retardation plate.

12. A method of manufacturing a display device, comprising:

a first step of sequentially laminating a first metal film, a first oxide film, and an optical filter on a first substrate, attaching a second substrate to a surface of the optical filter by using a first adhesive material such that the second substrate faces the first substrate through the optical filter, attaching a first support medium to a surface of the second substrate by using a first adhesive agent, and separating the first metal film from the first oxide film so as to form an optical film;

a second step of sequentially laminating a second metal film, and a second oxide film on a third substrate, and forming a layer including a pixel on the second oxide film; and a third step of attaching the first oxide film to a surface of the layer including the pixel of the third substrate by using a second adhesive material after the first and second steps, separating the second metal film from the second oxide film, attaching a fourth substrate to a surface of the second oxide film by using a third adhesive material, and removing the first adhesive agent and the first support medium.

13. A method of manufacturing a display device, comprising:

a first step of sequentially laminating a first metal film, a first oxide film, and an optical filter on a first substrate, attaching a first support medium to a surface of the optical filter by using a first adhesive agent such that the first support medium faces the first substrate through the optical filter, and separating the first metal film from the first oxide film;

a second step of attaching a second substrate to a surface of the first oxide film by using a first adhesive material, and removing the first support medium and the first adhesive agent so as to form an optical film;

a third step of sequentially laminating a second metal film, and a second oxide film on a third substrate, and forming a layer including a pixel on the second oxide film; and a fourth step of attaching the optical filter to a surface of the layer including the pixel of the third substrate by using a second adhesive material after the first to third steps, separating the second metal film from the second oxide film, and attaching a fourth substrate to a surface of the second oxide film by using a third adhesive material.

14. The method of manufacturing the display device according to claim 9, wherein the first substrate and the third substrate are any of a quartz substrate, a ceramic substrate, a silicon substrate, a metal substrate, and a stainless substrate, while the second substrate and fourth substrate are any of plastic, a polarizing plate, and a polarizing plate having a retardation plate.

15. The method of manufacturing the display device according to any one of claim 9, claim 12, and claim 13, wherein a second metal oxide film is formed between the second metal film and the second oxide film simultaneously with forming the second metal film and the second oxide film.

16. The method of manufacturing the display device according to any one of claim 9, claim 12, and claim 13, wherein a second metal oxide film is formed between the second metal film and the second oxide film simultaneously with forming the second metal film and the second oxide film, and wherein the second oxide film is formed after oxidizing a surface of the second metal film to form the second metal oxide film.

17. The method of manufacturing the display device according to any one of claim 1, claim 5, claim 6, claim 9, claim 12, and claim 13, wherein a first metal oxide film is formed between the first metal film and the first oxide film simultaneously with forming the first metal film and the first oxide film.

18. The method of manufacturing the display device according to any one of claim 1, claim 5, claim 6, claim 9, claim 12, and claim 13, wherein a first metal oxide film is formed between the first metal film and the first oxide film simultaneously with forming the first metal film and the first oxide film, and wherein the first oxide film is formed after oxidizing a surface of the first metal film to form the first metal oxide film.

19. The method of manufacturing the display device according to any one of claim 5, claim 6, claim 12, and claim 13, wherein the optical film includes the second substrate and the optical filter.

20. The method of manufacturing the display device according to any one of claim 1, claim 5, claim 6, claim 9, claim 12, and claim 13, wherein a liquid crystal material is filled between the layer including the pixel and the optical filter.

21. The method of manufacturing the display device according to any one of claim 1, claim 5, claim 6, claim 9, claim 12, and claim 13, wherein a second pixel electrode is formed on the optical filter.

22. The method of manufacturing the display device according to any one of claim 1, claim 5, claim 6, claim 9, claim 12, and claim 13, wherein a semiconductor element and a pixel electrode connecting to the semiconductor element are formed on the second oxide film.

23. The method of manufacturing the display device according to any one of claim 1, claim 5, claim 6, claim 9, claim 12, and claim 13, wherein a semiconductor element and a pixel electrode connecting to the semiconductor element are formed on the second oxide film, and wherein the semiconductor element is a TFT, an organic semiconductor transistor, a diode, or an MIM element.

24. The method of manufacturing the display device according to any one of claim 1, claim 5, claim 6, claim 9, claim 12, and claim 13, wherein the optical filter is a color filter or a color conversion filter.

25. The method of manufacturing the display device according to any one of claim 1, claim 5, claim 6, claim 9, claim 12, and claim 13, wherein the first metal film or the second metal film is formed of an element selected from titanium, aluminum, tantalum, tungsten, molybdenum, copper, chromium, neodymium, iron, nickel, cobalt, ruthenium, rhodium, palladium, osmium, iridium; a single layer including an alloy material or a compound material containing the above-mentioned elements as its main constituent; or a lamination layer thereof.

26. The method of manufacturing the display device according to any one of claim 1, claim 5, claim 6, claim 9, claim 12, and claim 13, wherein the first oxide film or the second oxide film is formed of silicon oxide, silicon oxynitride, or metal oxide.

27. The method of manufacturing the display device according to any one of claim 1, claim 5, claim 6, claim 9, claim 12, and claim 13, wherein the support medium is a glass substrate, a quartz substrate, a metal substrate, or a ceramic substrate.

28. The method of manufacturing the display device according to any one of claim 1, claim 5, claim 6, claim 9, claim 12, and claim 13, wherein the first adhesive agent is a reactive peelable adhesive material, a thermal peelable adhesive material, a light peelable adhesive material, an anaerobic peelable adhesive material, or a member having adhesive layers made from one or more of the above adhesive materials on both surfaces thereof.

29. The method of manufacturing the display device according to any one of claim 1, claim 5, claim 6, claim 9, claim 12, and claim 13, wherein a first metal oxide film is formed between the first metal film and the first oxide film.

30. The method of manufacturing the display device according to any one of claim 9, claim 12, and claim 13, wherein a second metal oxide film is formed between the second metal film and the second oxide film.

31. The method of manufacturing the display device according to any one of claim 1, claim 5, claim 6, claim 9, claim 12, and claim 13, wherein a second metal oxide film is formed between the second metal film and the second oxide film, and wherein after forming a spacer on a surface of the layer including the pixel, the layer including the pixel is attached to the second substrate or the third substrate.

32. The method of manufacturing the display device according to any one of claim 1, claim 5, claim 6, claim 9, claim 12, and claim 13, wherein the display device is one selected from the group consisting of a liquid crystal display device, a light emitting display device, a digital micromirror device, a plasma display panel, a field emission display, and an electrophoretic display device.

* * * * *